United States Patent
Wald et al.

(10) Patent No.: US 10,254,466 B2
(45) Date of Patent: *Apr. 9, 2019

(54) OPTICAL WAVEGUIDE FOR GUIDING ILLUMINATION LIGHT

(71) Applicant: Carl Zeiss SMT GmbH, Oberkochen (DE)

(72) Inventors: Christian Wald, Aalen (DE); Stefan Schaff, Ellwangen (DE); Markus Deguenther, Aalen (DE); Daniel Runde, Satteldorf (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/608,390

(22) Filed: May 30, 2017

(65) Prior Publication Data

US 2017/0261680 A1 Sep. 14, 2017

Related U.S. Application Data

(63) Continuation of application No. 14/833,954, filed on Aug. 24, 2015, now Pat. No. 9,671,548, which is a (Continued)

(30) Foreign Application Priority Data

Mar. 14, 2013 (DE) .......... 10 2013 204 442

(51) Int. Cl.
*G02B 6/26* (2006.01)
*F21V 8/00* (2006.01)
(Continued)

(52) U.S. Cl.
CPC ......... *G02B 6/0055* (2013.01); *G02B 6/0053* (2013.01); *G02B 6/0096* (2013.01);
(Continued)

(58) Field of Classification Search
None
See application file for complete search history.

(56) References Cited

U.S. PATENT DOCUMENTS 4,568,835 A 2/1986 Imamura
4,834,497 A 5/1989 Angel
(Continued)

FOREIGN PATENT DOCUMENTS

DE 29 29 186 A1 2/1981
DE 41 24 311 A1 1/1993
(Continued)

OTHER PUBLICATIONS

International Search Report for corresponding International Patent Appln No. PCT/EP2014/054436 dated Jul. 23, 2014.
(Continued)

*Primary Examiner* — Chad H Smith
(74) *Attorney, Agent, or Firm* — Fish & Richardson P.C.

(57) ABSTRACT

An optical waveguide serves for guiding illumination light. The waveguide has a waveguide main body for guiding the illumination light between a main body entrance region and a main body exit region. At least one coupling-out device is provided in the main body exit region. Via the coupling-out device, at least one coupling-out illumination light partial beam is coupled out from the illumination light emerging from the waveguide main body. This is done such that the coupling-out illumination light partial beam can be separated from the rest of the illumination light beam emerging from the waveguide main body. This results in a waveguide having improved possibilities for use when guiding illumination light.

32 Claims, 23 Drawing Sheets

Related U.S. Application Data continuation of application No. PCT/EP2014/054436, filed on Mar. 7, 2014.

(60) Provisional application No. 61/781,123, filed on Mar. 14, 2013.

(51) Int. Cl.
*G02B 27/09* (2006.01)
*G03F 7/20* (2006.01)

(52) U.S. Cl.
CPC ..... *G02B 27/0994* (2013.01); *G03F 7/70075* (2013.01); *G03F 7/70616* (2013.01); *G02B 6/262* (2013.01)

(56) References Cited

U.S. PATENT DOCUMENTS

| | | | |
|---|---|---|---|
| 4,918,583 | A | 4/1990 | Kudo et al. |
| 5,059,013 | A | 10/1991 | Jain |
| 5,224,200 | A | 6/1993 | Rasmussen et al. |
| 5,473,408 | A | 12/1995 | Hoffman et al. |
| 5,479,543 | A | 12/1995 | Black |
| 6,536,914 | B2 | 3/2003 | Hoelen et al. |
| 6,552,846 | B1 | 4/2003 | Suzuki |
| 6,870,683 | B2 | 3/2005 | Park |
| 9,671,548 | B2 * | 6/2017 | Wald ............... G02B 27/0994 |
| 2001/0012419 | A1 | 8/2001 | Tajima et al. |
| 2001/0012429 | A1 * | 8/2001 | Wach ............... A61B 5/14546 385/115 |
| 2003/0058383 | A1 | 3/2003 | Jagt et al. |
| 2005/0201708 | A1 | 9/2005 | Arishima |
| 2006/0082888 | A1 | 4/2006 | Huibers |
| 2006/0285111 | A1 | 12/2006 | Raymond et al. |
| 2008/0267245 | A1 | 10/2008 | Tanaka et al. |
| 2009/0002833 | A1 | 1/2009 | Shklover et al. |
| 2010/0142563 | A1 | 6/2010 | Hu et al. |
| 2015/0362660 | A1 | 12/2015 | Wald et al. |

FOREIGN PATENT DOCUMENTS

| | | |
|---|---|---|
| EP | 0 724 498 B1 | 8/1996 |
| EP | 0 981 936 A1 | 3/2000 |
| EP | 2 219 078 A1 | 8/2010 |
| JP | 1983-014108 A | 1/1983 |
| JP | 1990010501 U | 1/1990 |
| JP | 11-162837 | 6/1999 |
| JP | 2000-510604 A | 8/2000 |
| JP | 2006-520491 A | 9/2006 |
| WO | WO 97/34175 A1 | 9/1997 |
| WO | WO 98/52389 | 11/1998 |
| WO | WO 2004/083926 A1 | 9/2004 |
| WO | WO 2012/137842 | 10/2012 |

OTHER PUBLICATIONS

German Office Action, with translation thereof, for corresponding DE Appl No. 10 2013 204 442.9, dated Oct. 28, 2013.

Japanese office action, with English translation thereof, for corresponding JP Appl No. 2015-562039, dated Mar. 5, 2018.

* cited by examiner

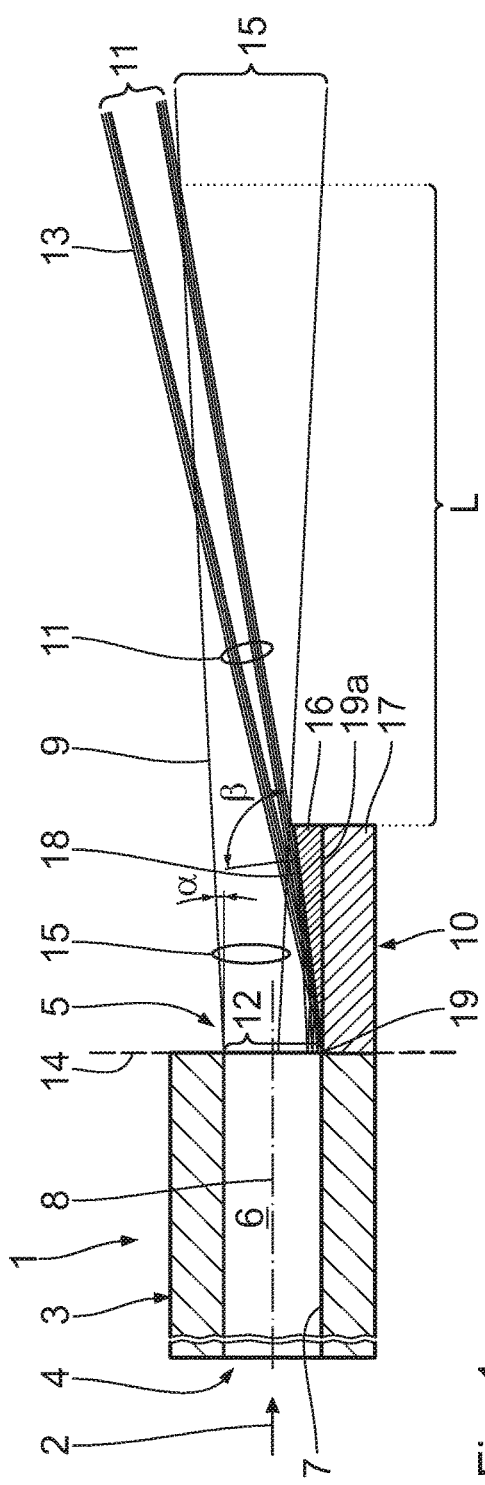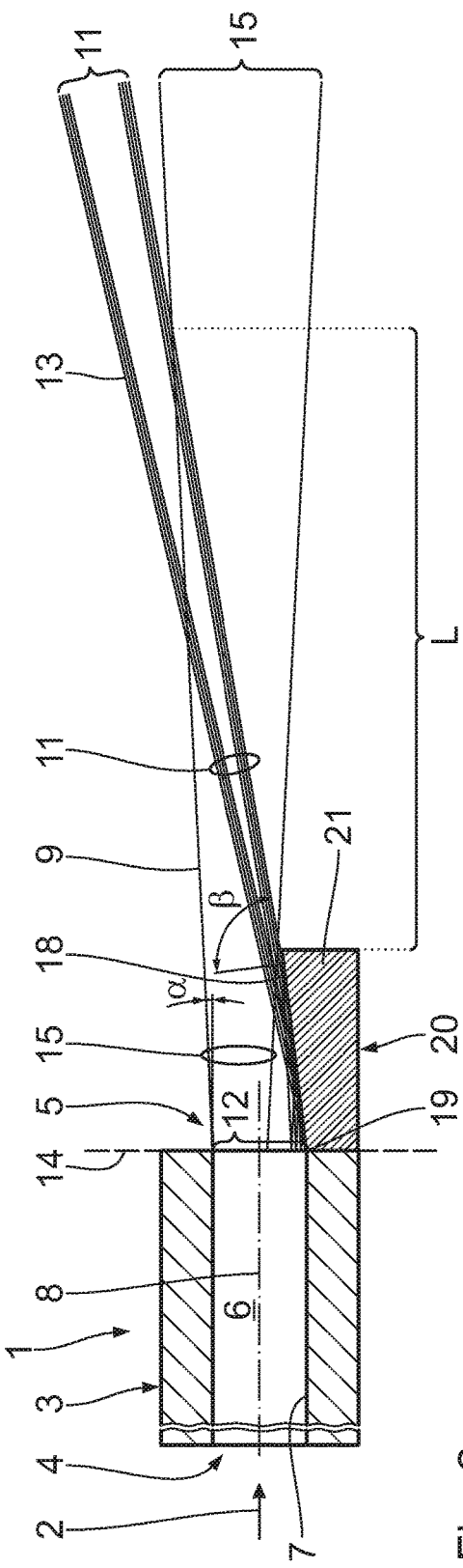

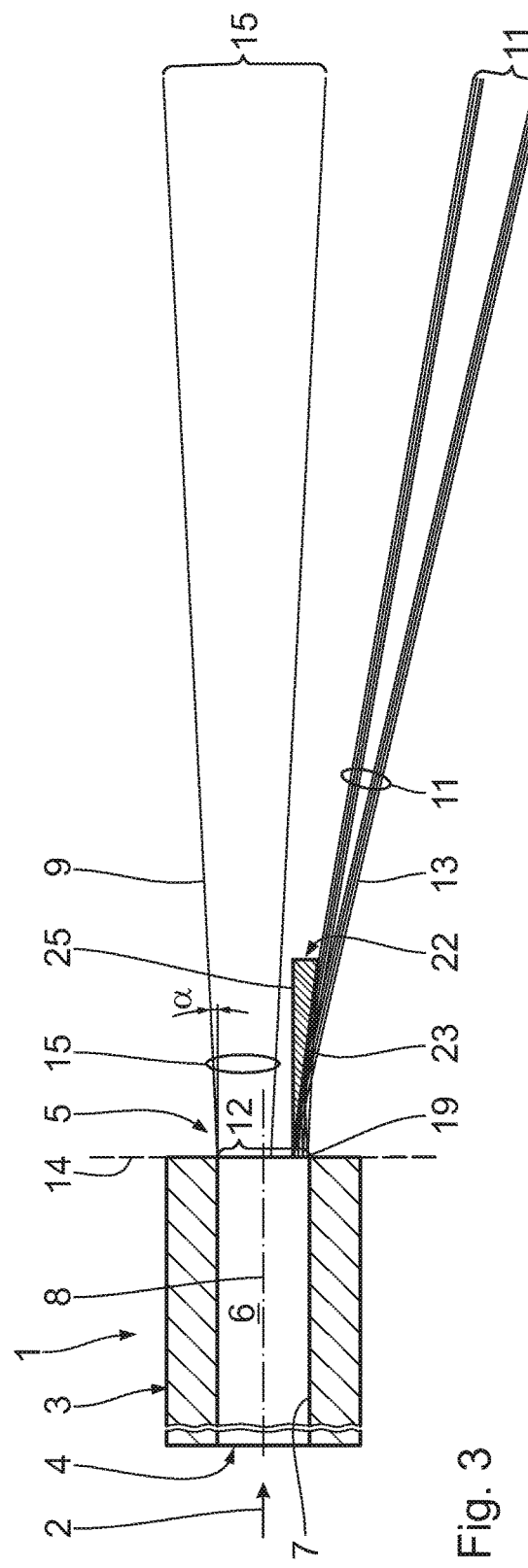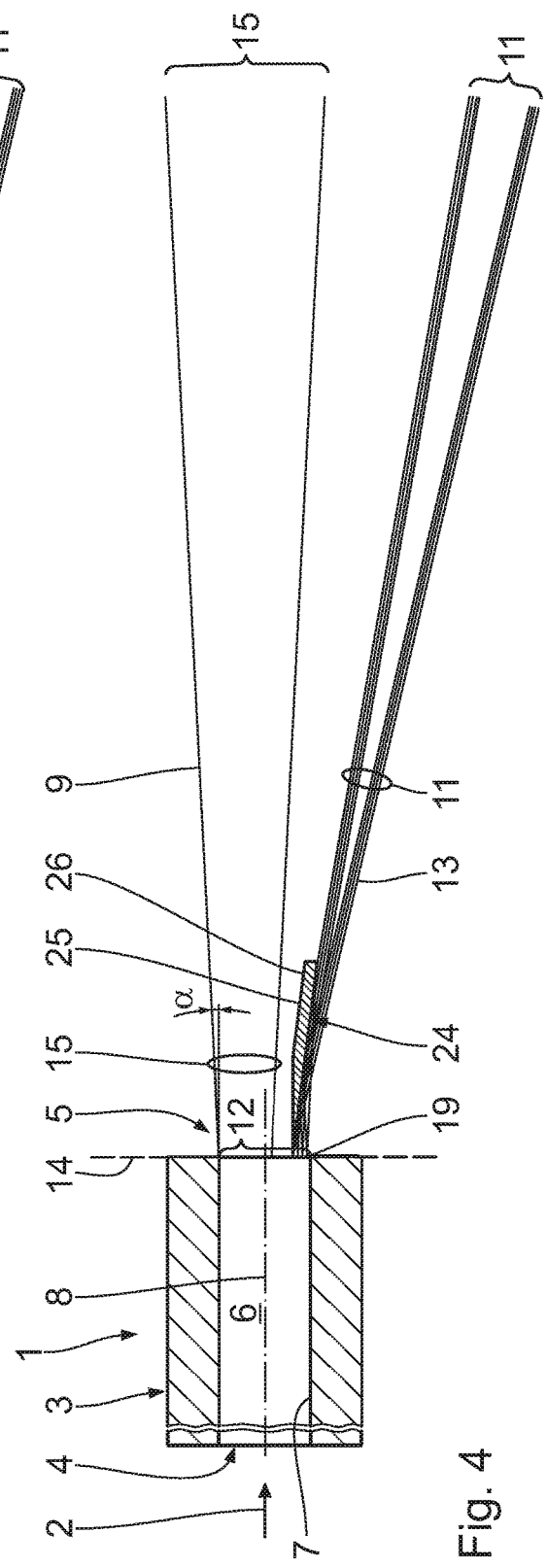

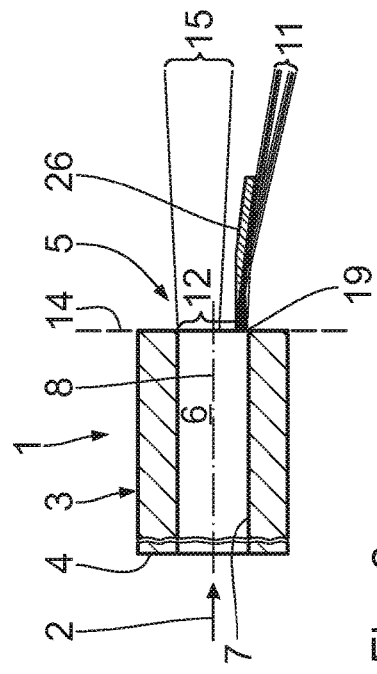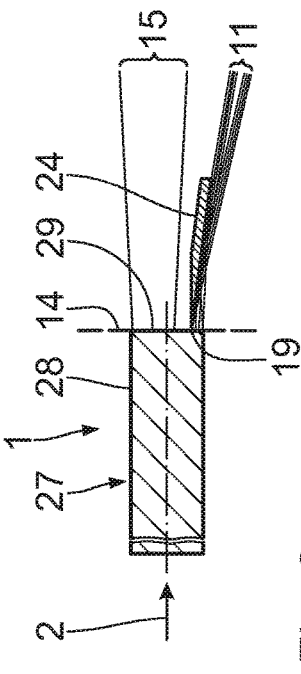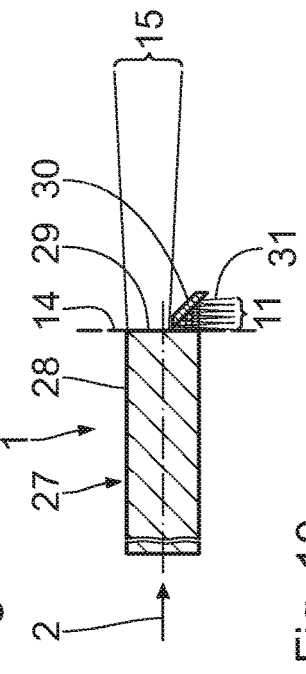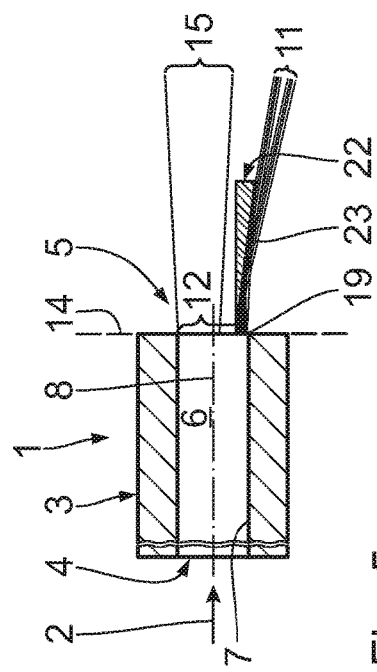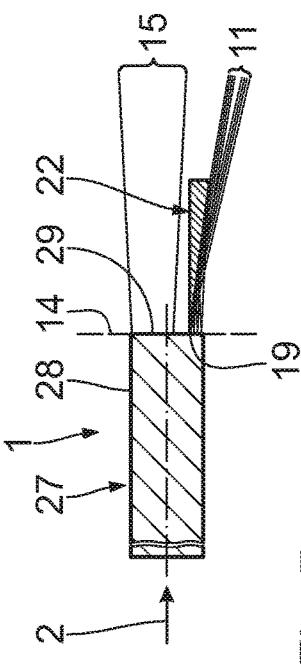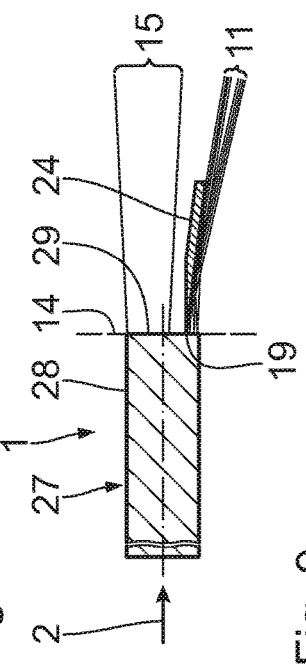

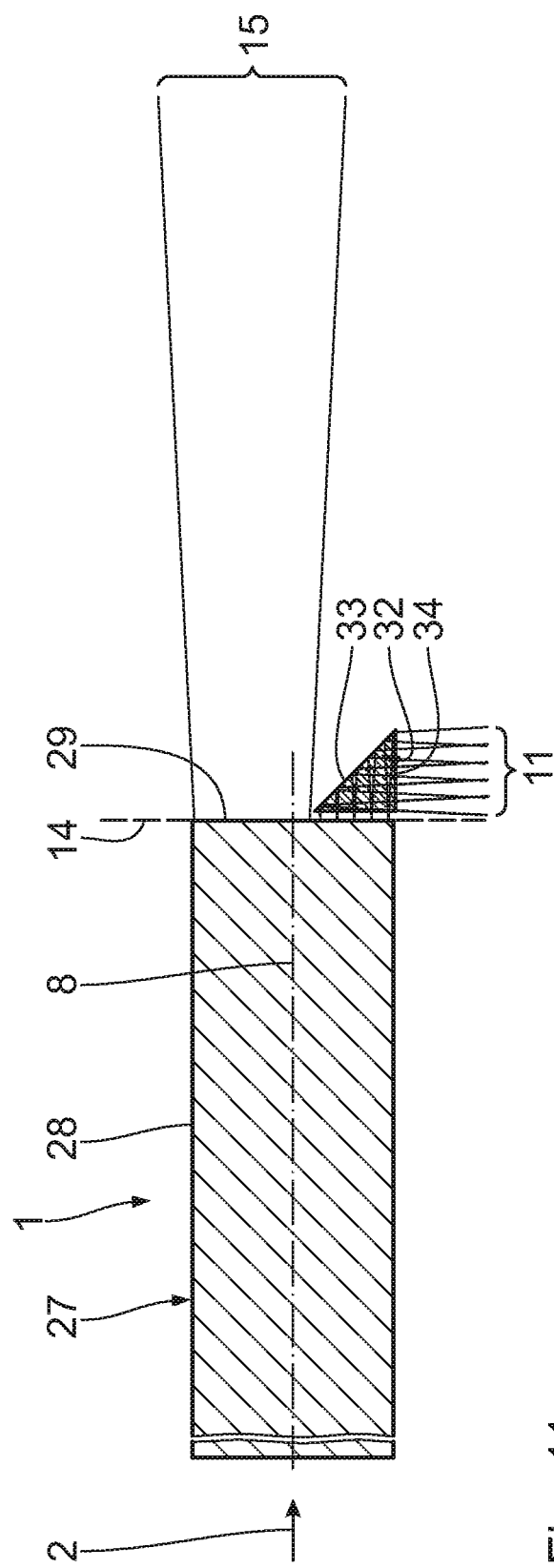

OPTICAL WAVEGUIDE FOR GUIDING ILLUMINATION LIGHT

CROSS-REFERENCE TO RELATED APPLICATIONS

The present application is a continuation of, and claims benefit under 35 USC 120 to, U.S. application Ser. No. 14/833,954, filed Aug. 24, 2015, now U.S. Pat. No. 9,671, 548, which is a continuation of, and claims benefit under 35 USC 120 to, international application of PCT/EP2014/054436, filed Mar. 7, 2014, which claims benefit under 35 USC 119 of German Application No. 10 2013 204 442.9, filed Mar. 14, 2013. International application of PCT/EP2014/054436 also claims priority under 35 USC 119(e) to U.S. Provisional Application No. 61/781,123, filed Mar. 14, 2013. The contents of U.S. application Ser. No. 14/833,954, international application of PCT/EP2014/054436 and German patent application 10 2013 204 442.9 are incorporated by reference.

The invention relates to an optical waveguide for guiding illumination light. Furthermore, the invention relates to an assembly comprising such a waveguide, an illumination optical unit comprising such an assembly, and an inspection apparatus comprising such an illumination optical unit.

Optical waveguides are known for example from U.S. Pat. No. 4,918,583, U.S. Pat. No. 6,552,846 B1, U.S. Pat. No. 5,224,200, US 2003/0058383 A1, U.S. Pat. No. 6,536, 914 B2, U.S. Pat. No. 7,070,280 B2, US 2009/0002833 A1, DE 412 43 11 A1, US 2008/0267245 A1, U.S. Pat. No. 6,870,683 B2, and US 2006/0082888 A1, EP 0 724 498 A, U.S. Pat. No. 5,059,013, U.S. Pat. No. 5,473,408 and EP 0 981 936 A1. In the technical literature in German, such waveguides are also designated as "Stab" ["rod"], as "Hohlstab" ["hollow rod"], as "Integratoren" ["integrators"] or as "Stabintegratoren" ["rod integrators"]. In the technical literature in English, such waveguides are designated as "rod type integrator", as "light-pipe optical integrator", as "hollow light pipe", as "light pipe having reflective inner walls" or as "optical waveguide". A waveguide within the meaning of the description below is an optical component which does not necessarily carry out a selection of specific modes and/or a selection of specific wavelengths of the guided illumination light.

Such waveguides can be used in illumination optical units.

It is an object of the present invention to develop an optical waveguide of the type mentioned in the introduction such that its possibilities for use when guiding illumination light are improved.

This object is achieved according to the invention via an optical waveguide for guiding illumination light comprising a waveguide main body for guiding the illumination light between a main body entrance region and a main body exit region. The waveguide comprises at least one coupling-out device in the main body exit region near an exit plane or near a plane that is conjugate with respect thereto, by which at least one coupling-out illumination light partial beam is coupled out from the illumination light emerging from the waveguide main body such that the coupling-out illumination light partial beam can be separated from the rest of the illumination light beam emerging from the waveguide main body. The coupling-out device is arranged such that the coupling-out illumination light partial beam is coupled out from an intermediate field plane, which can be imaged into an illumination field, or from an illumination field plane.

It has been recognized according to the invention that the least one coupling-out device leads to the possibility of feeding both the coupling-out illumination light partial beam coupled out and the rest of the illumination light beam to a further use. In the present description, a beam or light beam designates the, in particular directional, emission of an illumination light source. Such a light beam can be guided by optical components and comprises a quantity of illumination light individual rays which pass from a defined start surface through the optical components to a defined target surface. One example thereof is an imaging light beam that passes from an object field of a projection lens through the aperture of the projection lens toward the image field.

Both the rest of the illumination light beam and the coupling-out illumination light partial beam have a defined, finite cross section and a defined divergence. In this case, the rest of the illumination light beam denotes that illumination light in which is not coupled out. It has been recognized, in particular, that illumination optical units which are appropriate for the use of the optical waveguide often do not have to illuminate an entire object film, but rather only a part thereof, wherein an object to be illuminated is then completely illuminated by a displacement relative to the illuminated partial object field. Such a displacement can be effected in a scanning fashion. Since, in these cases only a part of an entire object field has to be illuminated, illumination light which was originally provided for the illumination of the rest of the object field is also available for other purposes, in principle. It is often the case during imaging of an illuminated object field that only a segment of the entire object field is detected in an image plane of a projection optical unit for example via a spatially resolving detection device, e.g. a camera. In this case, the projection optical unit only has to image the corresponding segment of the object field. An illumination system comprising an illumination optical unit and a light source in this case only has to illuminate the segment of the object field, if appropriate with a safety excess. The object field detected during the detection is then only a part of the object field detectable overall by the projection optical unit. The object field segment used during the detection can have a plurality of mutually separate object field sections.

The illumination light beam that is not coupled out can be used for illuminating the illumination field. The coupling-out illumination light partial beam can likewise be used for illumination, but can also be used for other purposes, for example can be measured in order to draw conclusions about the manner of operation and/or operating quality of a light source and/or about an alignment from measurement parameters of the coupling-out illumination light partial beam. The coupling-out illumination light partial beam can be directed onto a sensor, for example, which measures a power of the coupling-out illumination light partial beam. The quantity of light of the coupling-out illumination light partial beam can be in a fixed ratio to that of the rest of the illumination light beam, such that, from a measurement parameter measured, if appropriate, with regard to the coupling-out illumination light partial beam, it is possible to deduce the associated measurement parameter of the rest of the illumination light beam. The fact that the coupling-out device is arranged in the main body exit region makes it possible to realize a very precise predefinition of the beam partial cross section that is coupled out from the illumination light emerging overall from the waveguide main body. This results in a compact arrangement. The coupling-out device can be connected to the waveguide main body in a supporting fashion, which optimizes the stability of the coupling-out. An optical waveguide is suitable for guiding light or radiation in particular in the optical wavelength range. Wavelengths in the UV range, particularly in the DUV range, for example at 193 nm, can also be guided by the optical waveguide. The optical waveguide can be realized with a transmissive solid main body or with a hollow main body that is used reflectively. In so far as a reflectively used optical waveguide is used, illumination light wavelengths in the EUV range can also be guided, for example. A cross section of the coupling-out illumination light partial beam can constitute a part of a cross section of the illumination light that emerges from the waveguide main body. A cascading of coupling-out devices is also possible on which a plurality of coupling-out illumination light partial beams are coupled out successively from the illumination light.

The illumination light beam that is not coupled out can also be measured in order to draw conclusions about the manner of operation and/or operating quality of a light source and/or an alignment from measurement parameters of the illumination light beam that is not coupled out.

The coupling-out device can be arranged in or near an exit plane of the illumination light from the waveguide main body. Alternatively or additionally, the coupling-out device can also be arranged in a coupling-out plane that is optically conjugate with respect thereto, that is to say in particular in an image exit plane. This reduces requirements in particular in respect of a manufacturing precision and/or in respect of a positional accuracy of the coupling-out device. In so far as the coupling-out device is arranged in a plane that is conjugate with respect to the exit plane, an imaging magnification can be brought about with the aid of a corresponding imaging optical unit, such an exit region of the waveguide main body from which the illumination light emerges is imaged into the conjugate plane in a magnified fashion. This reduces the requirements in respect of a positional accuracy of the coupling-out device. Moreover, a smaller angular spectrum of the coupling-out illumination light partial beam that is then present makes it possible, for example, for the coupling-out illumination light partial beam to be coupled out with grazing incidence.

The coupling-out illumination light partial beam can be coupled out in operating intermissions of a used illumination. The coupling-out device used can then be a coupling-out stop which transmits exclusively the coupling-out illumination light partial beam and in this way separates it from the rest of the illumination light beam that emerges from the waveguide main body. This simplifies the embodiment of the coupling-out device. It is then possible to select an arbitrary segment from the entire illumination light beam as the coupling-out illumination light partial beam with the aid of the coupling-out stop. With regard, for example, to a position/orientation measurement of the waveguide relative to a light source, it is then possible to use an arbitrary segment from the illumination light beam.

The optical waveguide can also be used as a component of a projection exposure apparatus.

The waveguide can be embodied for use with illumination light in a light wavelength range used in the EUV (Extreme Ultra Violet), in the VUV (Vacuum Ultra Violet), in the DUV (Deep Ultra Violet), in the UV, in the VIS or else in the IR spectral range.

The coupling-out device can have at least one coupling-out mirror which is connected to the waveguide main body in the main body exit region. Such a coupling-out mirror can be manufactured with tenable outlay.

A connection of the coupling-out device, in particular of the at least one coupling-out mirror, to the main body exit region can be effected by a mechanical connection element or can be effected by cohesive engagement, frictional engagement or positively locking engagement. It is also possible for the coupling-out device, and in particular the coupling-out mirror, to be embodied integrally or monolithically with the waveguide main body. As an alternative to a coupling-out mirror, at least one lens element and/or at least one prism and/or at least one diffractive element can be part of the coupling-out device.

The coupling-out mirror can be operated with grazing incidence. Such an operating procedure leads, particularly at wavelengths in the EUV range, to low losses during the coupling-out. As an alternative to grazing incidence, that is to say to incidence with an angle of incidence that is greater than 70° and can be greater than 75°, 80°, 85° or 88°, it is also possible to realize a smaller angle of incidence, for example in the range of between 30° and 60°, in particular in the range of 45°, on the coupling-out mirror.

A mirror surface of the coupling-out mirror can face the rest of the illumination light beam. A mirror surface of the coupling-out mirror can face away from the rest of the illumination light beam. Such variants of an arrangement of the mirror surface have proved to be particularly suitable depending on the optical requirements and also the structural boundary conditions. A mirror surface faces the rest of the illumination light beam if the coupling-out illumination light partial beam is directed in the direction toward the rest of the illumination light beam by the mirror surface. The mirror surface of the coupling-out mirror faces away if the coupling-out illumination light partial beam is directed away from the rest of the illumination light beam by the mirror surface.

The waveguide main body can be fashioned as a hollow optical wave-guide having a tubular main body having a continuous waveguide cavity. Such a hollow waveguide can be realized with low throughput losses for the illumination light.

The waveguide main body can be fashioned as a solid body that is transmissive to the illumination light. Such a transmissive or transparent solid body as waveguide main body has proved to be particularly suitable in particular for illumination light wavelengths that are in the DUV range or are longer.

The coupling-out device can be fashioned as a prism attachment to the main body exit region. Such a prism attachment enables the coupling-out illumination light partial beam to be coupled out compactly.

The coupling-out illumination light partial beam can be coupled out at a prism wall of the prism attachment by an at least partial reflection at the optically less dense medium. Such a prism attachment can be fashioned with high reflection efficiency. One of the reflections during the coupling-out can be a total internal reflection at the optically less dense medium or at a reflective coating.

The coupling-out illumination light partial beam is coupled out at a prism wall of the prism attachment by refraction. Such a prism attachment can use a change in direction of the coupling-out illumination light partial beam, the change in direction being caused by the refraction, for separation from the rest of the illumination light beam. A refraction coupling-out at the prism wall, on the one hand, and a reflection at the same prism wall, on the other hand, can be used in combination. In this way, a plurality of coupling-out illumination light partial beams can be generated by one and the same prism wall. This can be used to feed this plurality of coupling-out partial beams to different or alternatively redundant intended applications. With the use of illumination light coupled out at the prism wall by a refraction, it is possible, by using an additional deflection optical unit, e.g. at least one mirror or at least one prism, to effect a coupling-out from the rest of the illumination light beam. The illumination light partial beam coupled out by refraction can also be fed, for example, to a sensor for measuring this coupling-out illumination light partial beam.

An optical assembly can comprise a waveguide as described above and a measuring device for detecting a measurement variable that is characteristic of the coupling-out illumination light partial beam. An inspection apparatus can comprise an illumination optical unit comprising such an assembly, a light source for generating the illumination light, and a detection device that detects an illumination field. The advantages of such an assembly, of an illumination optical unit comprising such an assembly and of such an inspection apparatus correspond to those which have already been explained above with reference to the waveguide according to the invention. The measuring device can comprise an aperture stop. The aperture stop can serve for influencing an angular spectrum of the coupling-out illumination light partial beam, which angular spectrum is to be detected by the measuring device. Alternatively or additionally, a stop can be provided with which, from the entire cross section of the coupling-out illumination light partial beam, a predefined segment is selected for detection. The measuring device can comprise a quadrant sensor. The measuring device can comprise at least one shading stop. The measuring device can be used for dosimetry measurement of the illumination light. In this case, the coupling-out illumination light partial beam is advantageously measured with an angular spectrum of individual rays within the coupling-out illumination light partial beam which corresponds exactly to the angular spectrum of the rest of the illumination light beam, made available to the further use. Dosimetry measurement errors arising on account of a deviation of an angular spectrum of the illumination light made available to the dosimetry measurement from the illumination light made available to the actual use are eliminated.

At least one sensor of the measuring device can be arranged in a detection plane situated in the region of a plane in which a ratio r of: a distance h1 between rays of the same order of reflection in the coupling-out illumination light partial beam, proceeding from an identical point in the waveguide entrance region; and a maximum distance h3 between rays of zero order of reflection in the coupling-out illumination light partial beam, passing through the same point in the waveguide exit region, is less than 1. Such an optical assembly gives rise to a resolution of different orders of reflection of the illumination light guided by the waveguide 1 in the detection plane. The order of reflection denotes the number of reflections of individual rays of the illumination light which the rays experience during guiding between the main body entrance region and the main body exit region of the waveguide. The ratio r=h1/h3 can be less than 0.7, can be less than 0.5 and less than 0.3.

The at least one sensor in the detection plane can detect a coupling-out beam segment of the entire coupling-out illumination light partial beam. Such an approach to detecting a beam segment avoids the requirement to evaluate the entire coupling-out beam segment via the sensor device. A coupling-out beam segment can be formed by a measurement window in the entire cross section of the coupling-out illumination light partial beam, which measurement window is significantly smaller than the entire beam cross section in both cross-sectional coordinates. Alternatively, the sensor can also detect a strip of the cross section of the coupling-out illumination light partial beam. In a direction perpendicular to the propagation of the coupling-out illumination light partial beam, therefore, the intensity of the beam can be integrated, wherein the strip detected lies at a predefined height of the beam cross section.

The assembly can comprise a plurality of sensors. Such a plurality of sensors can be arranged in pairs in order to improve a measurement stroke. The sensors can be arranged for detecting characteristic beam segments of the coupling-out illumination light partial beam. The sensors can be embodied for measuring a decentration and/or a tilt of the light source relative to the waveguide.

The optical assembly can be part of a regulating system for illuminating the illumination field in a regulated manner. In this case, a predefined desired illumination parameter can be tracked by measurement of an actual parameter by the sensor of the assembly via a corresponding control/regulating device. The actual parameter can be a decentration and/or a tilt of the light source relative to the waveguide. Alternatively, the detection device of an inspection apparatus described above can also be used for measuring the actual parameter. The inspection apparatus can be a wafer inspection apparatus or a mask inspection apparatus for corresponding components of projection lithography. The illumination optical unit can be a DUV or EUV illumination optical unit. The EUV illumination optical unit can be embodied for guiding illumination light in a wavelength range of between 5 nm and 30 nm.

Exemplary embodiments of the invention are explained in greater detail below with reference to the drawings, in which:

FIG. 1 shows a region of a light exit section of a hollow optical waveguide for guiding illumination light as part of a mask or wafer inspection apparatus for projection lithography with one embodiment of a coupling-out device for a coupling-out illumination light partial beam;

FIGS. 2 to 6 show further embodiments of coupling-out devices for the hollow optical waveguide;

FIG. 7 shows a waveguide configured as a solid body transparent to the illumination light, likewise for guiding illumination light as part of a mask or wafer inspection apparatus for projection lithography with one embodiment of a coupling-out device for a coupling-out illumination light partial beam;

FIGS. 8 to 13 show further embodiments of the coupling-out element for a waveguide configured as a solid body;

Figure 15:
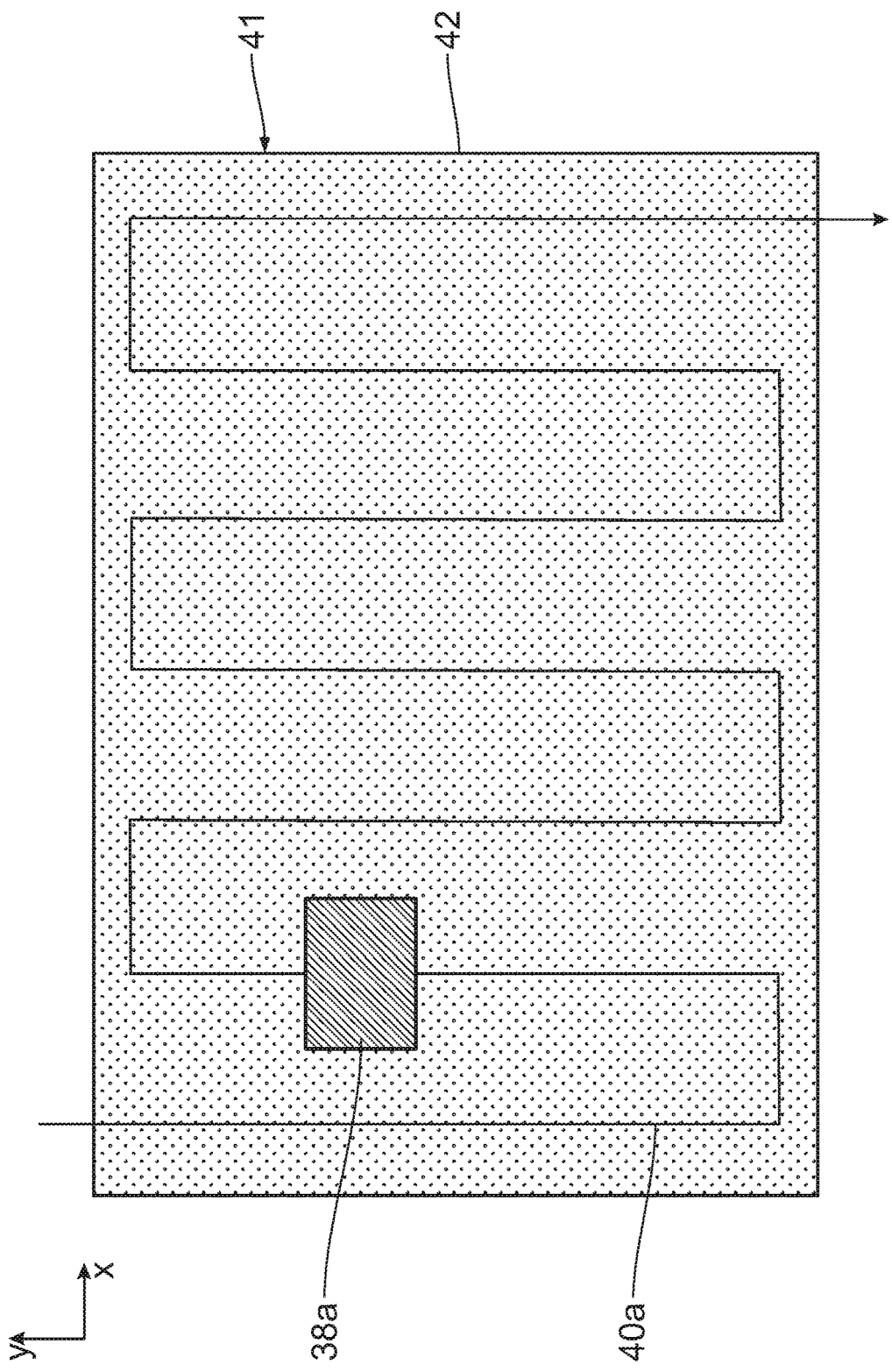
Figure 16:
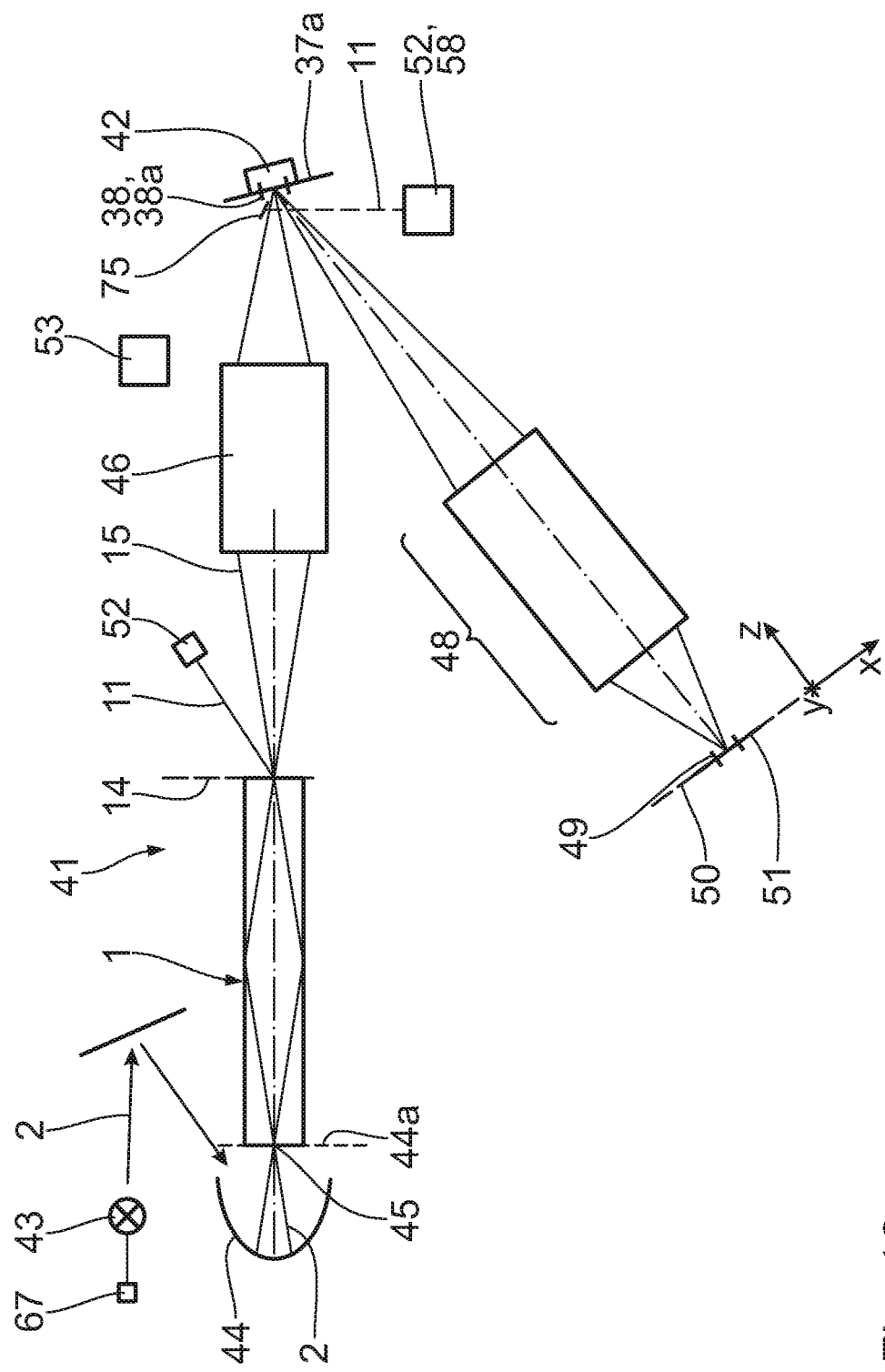
Figure 17:
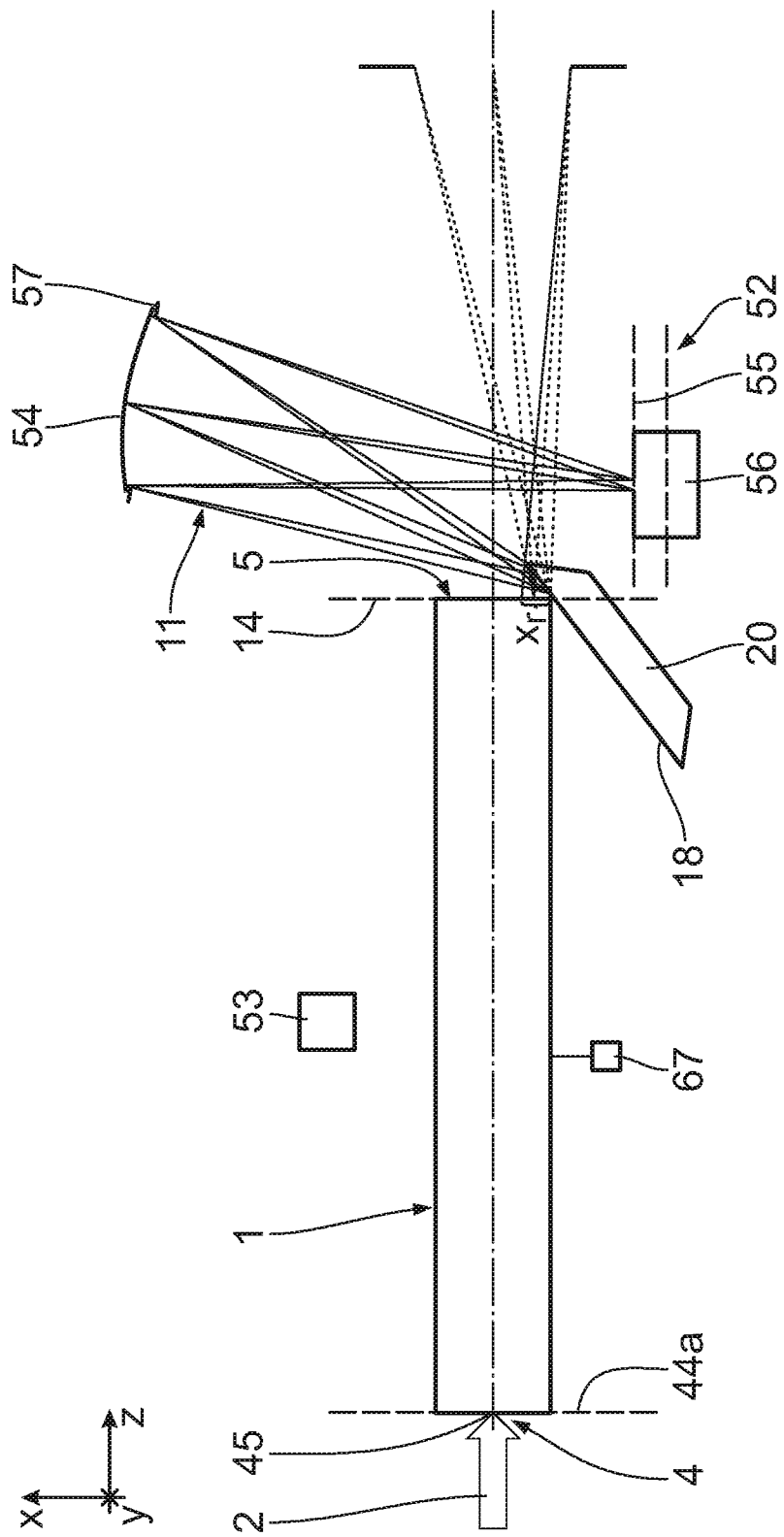
Figure 18:
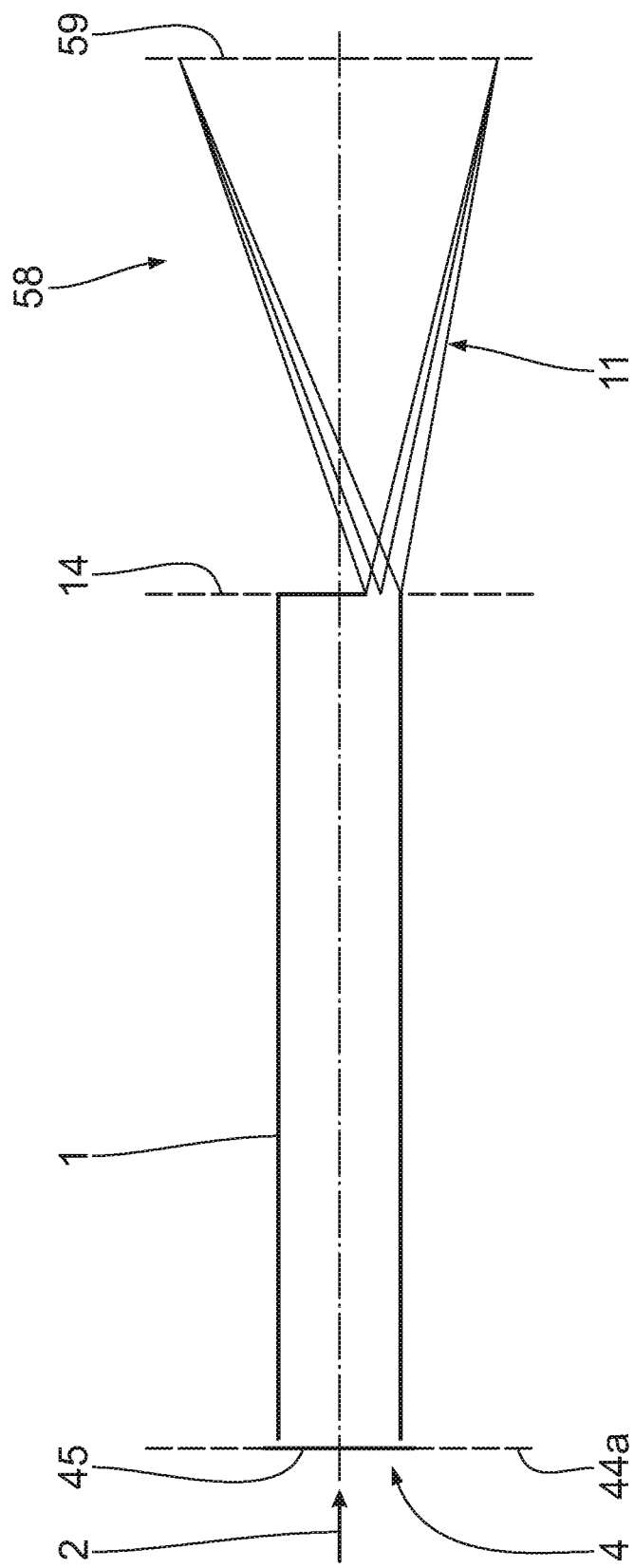
Figure 19:
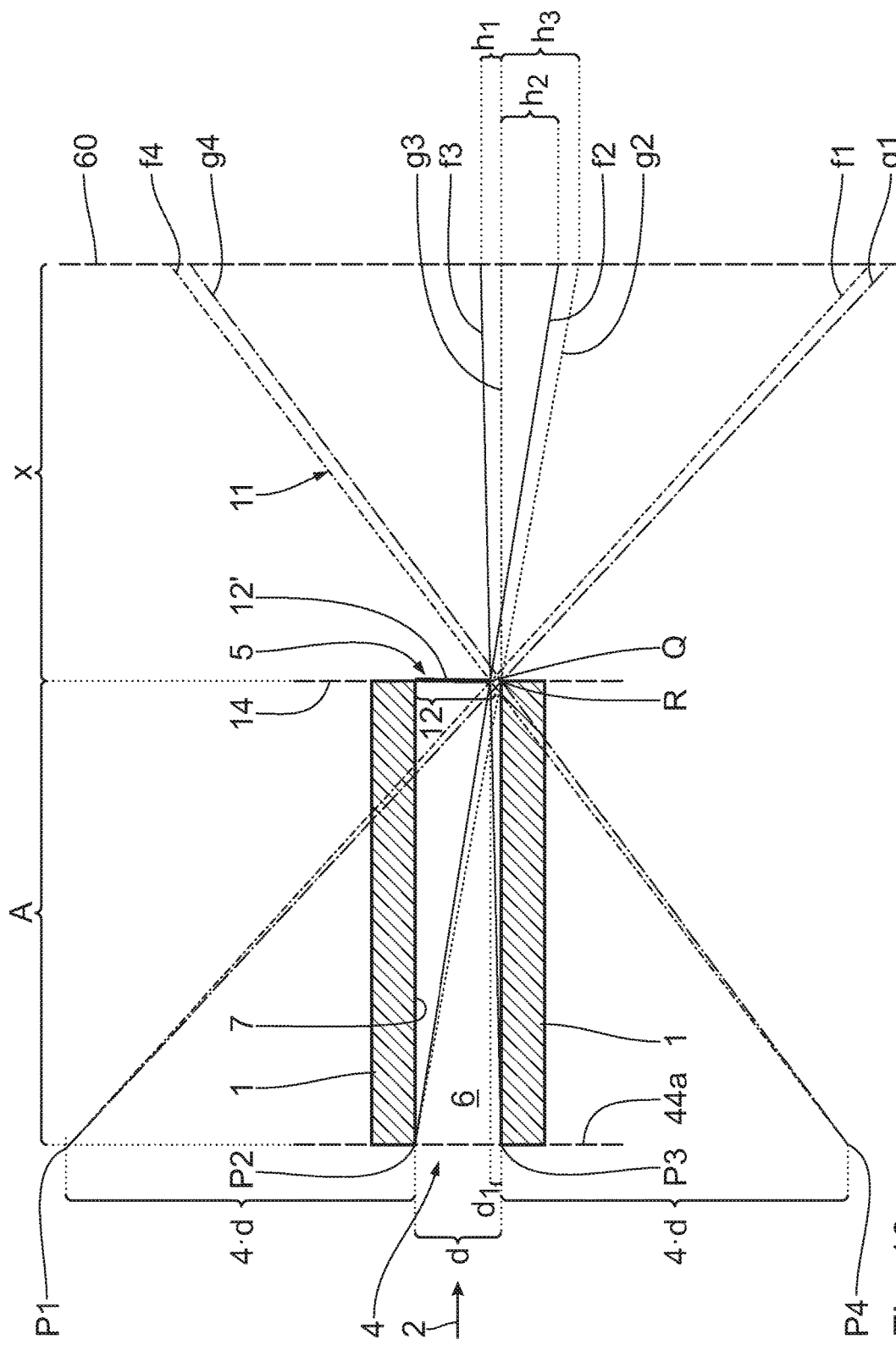
Figure 20:
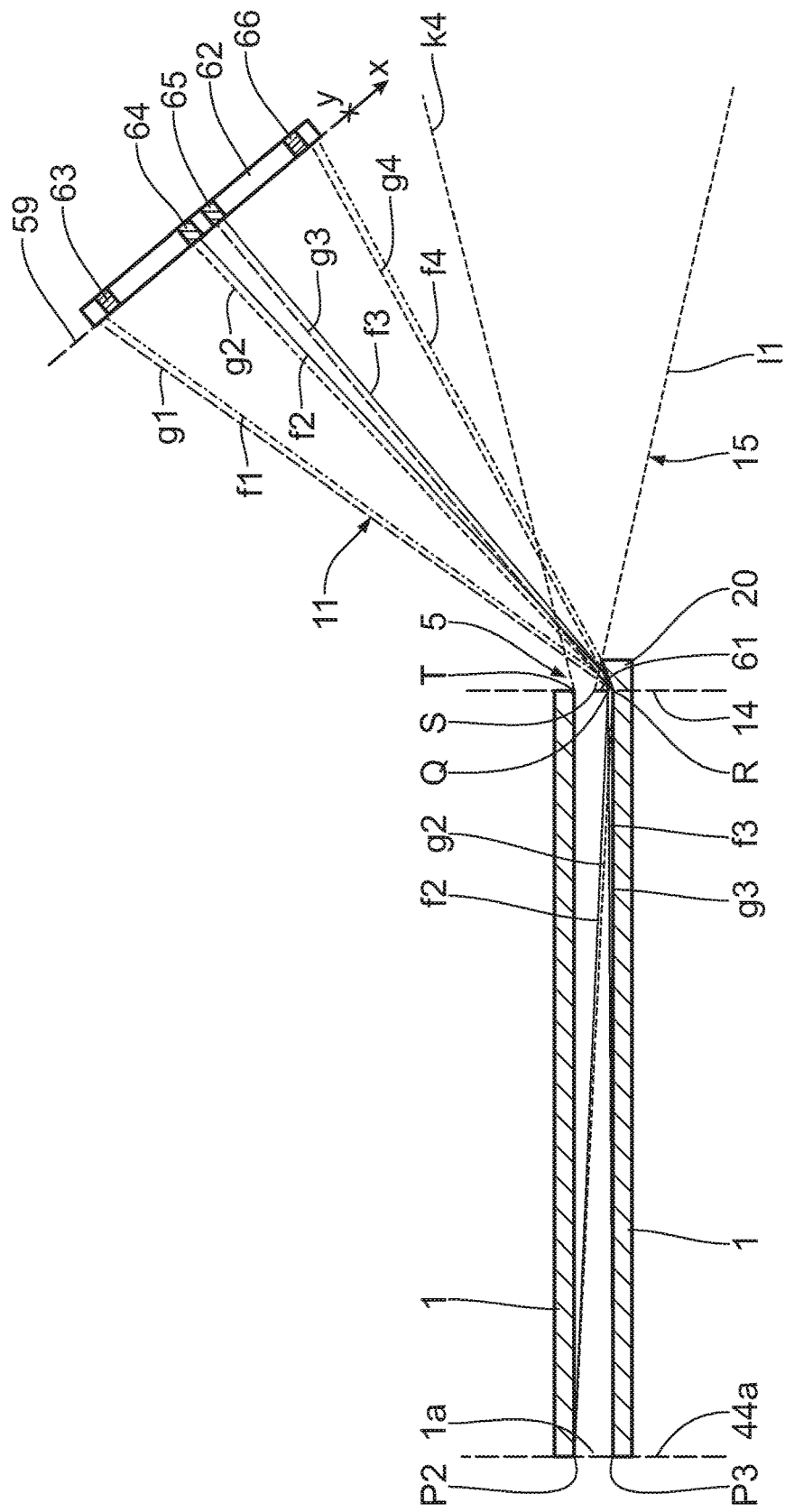
Figure 21:
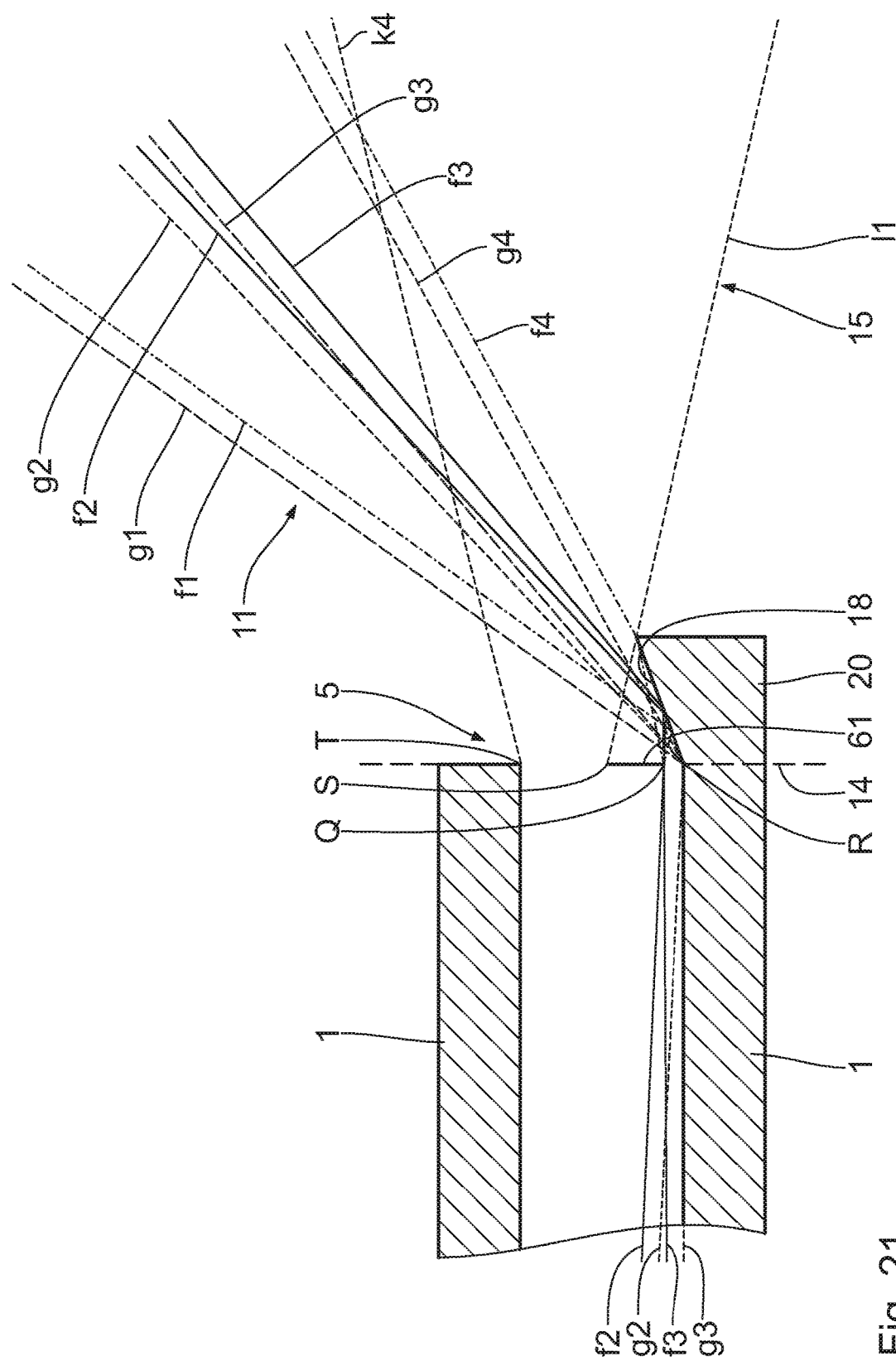
Figure 22:
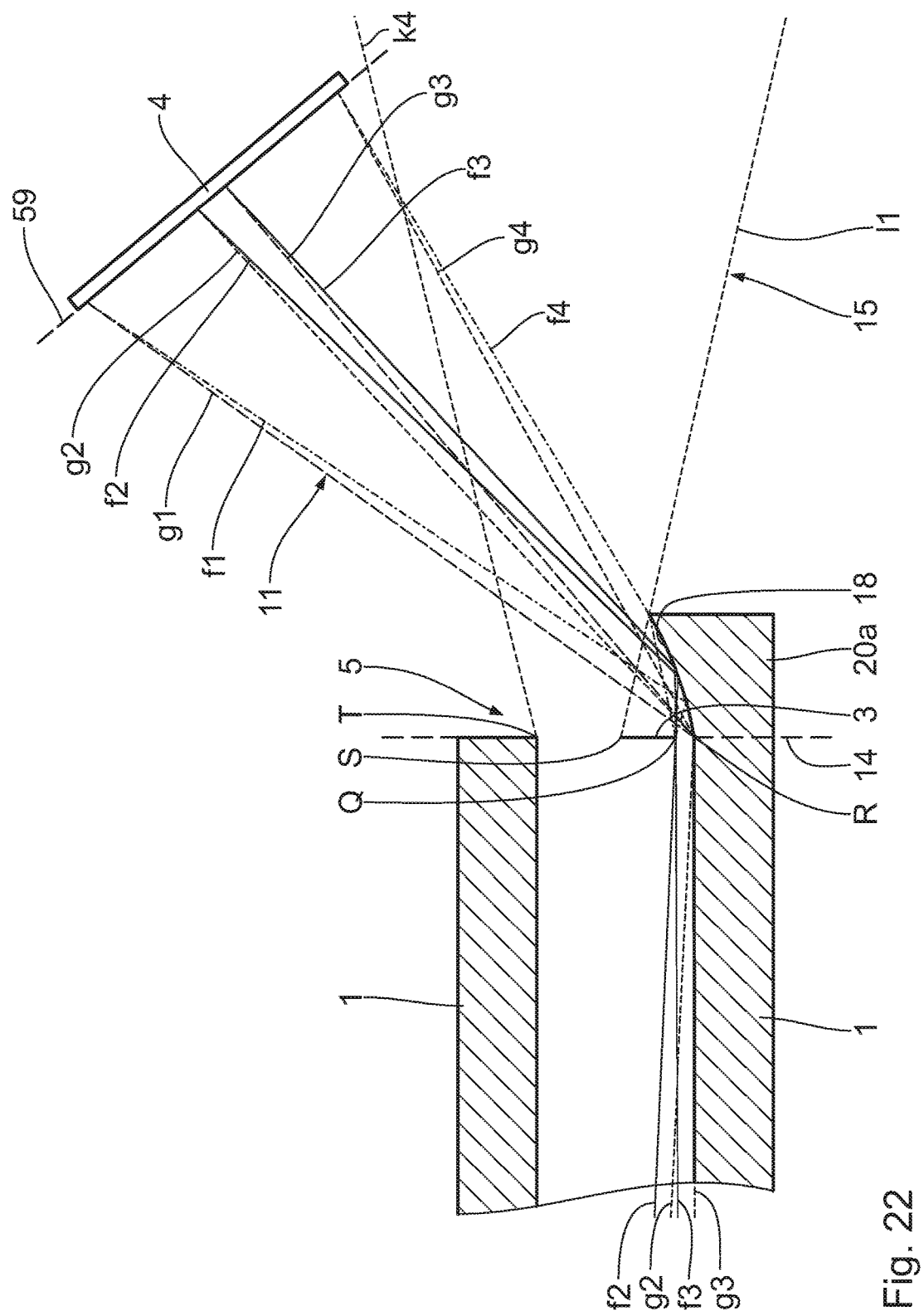
Figure 23:
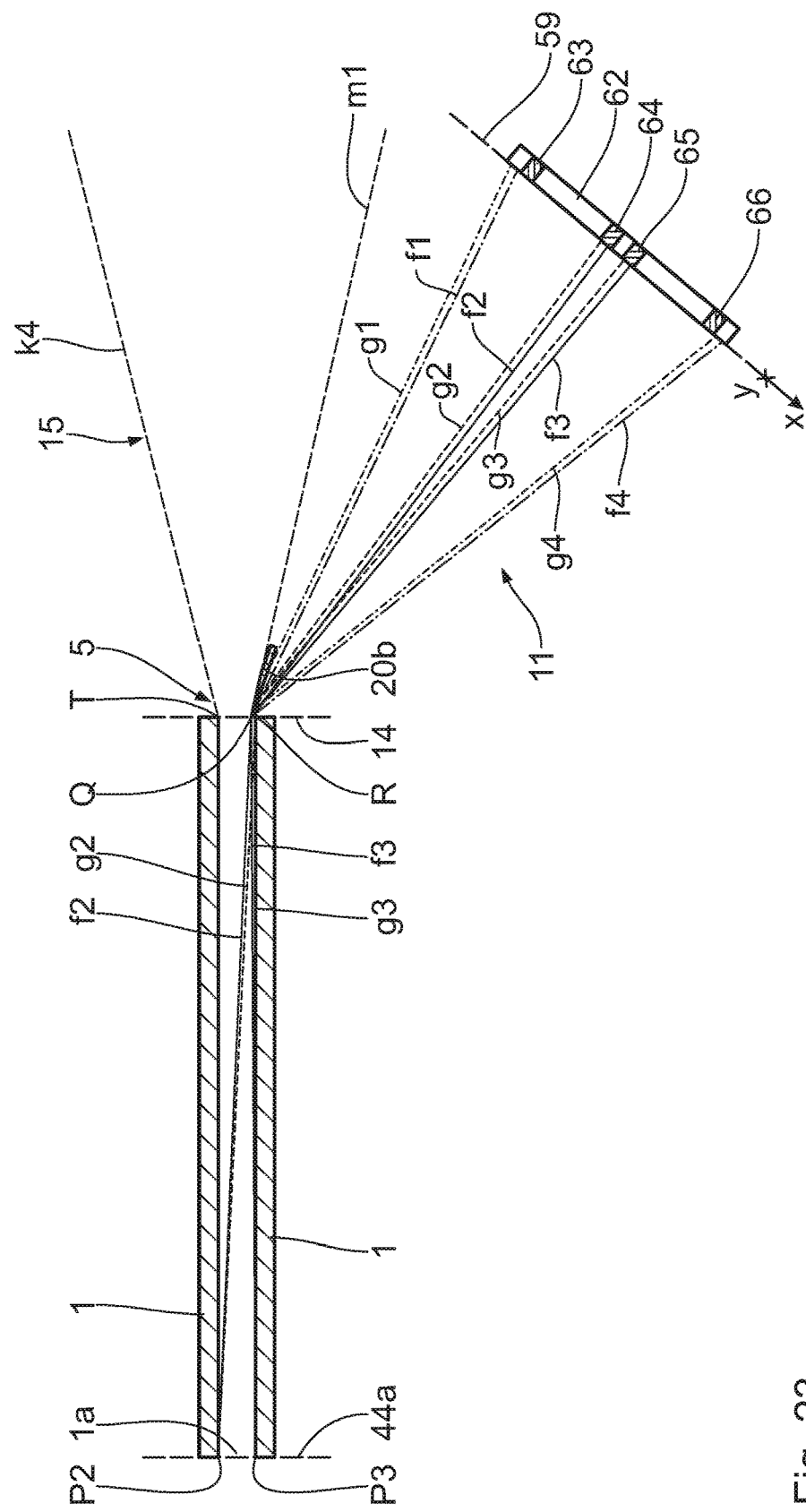
Figure 24:
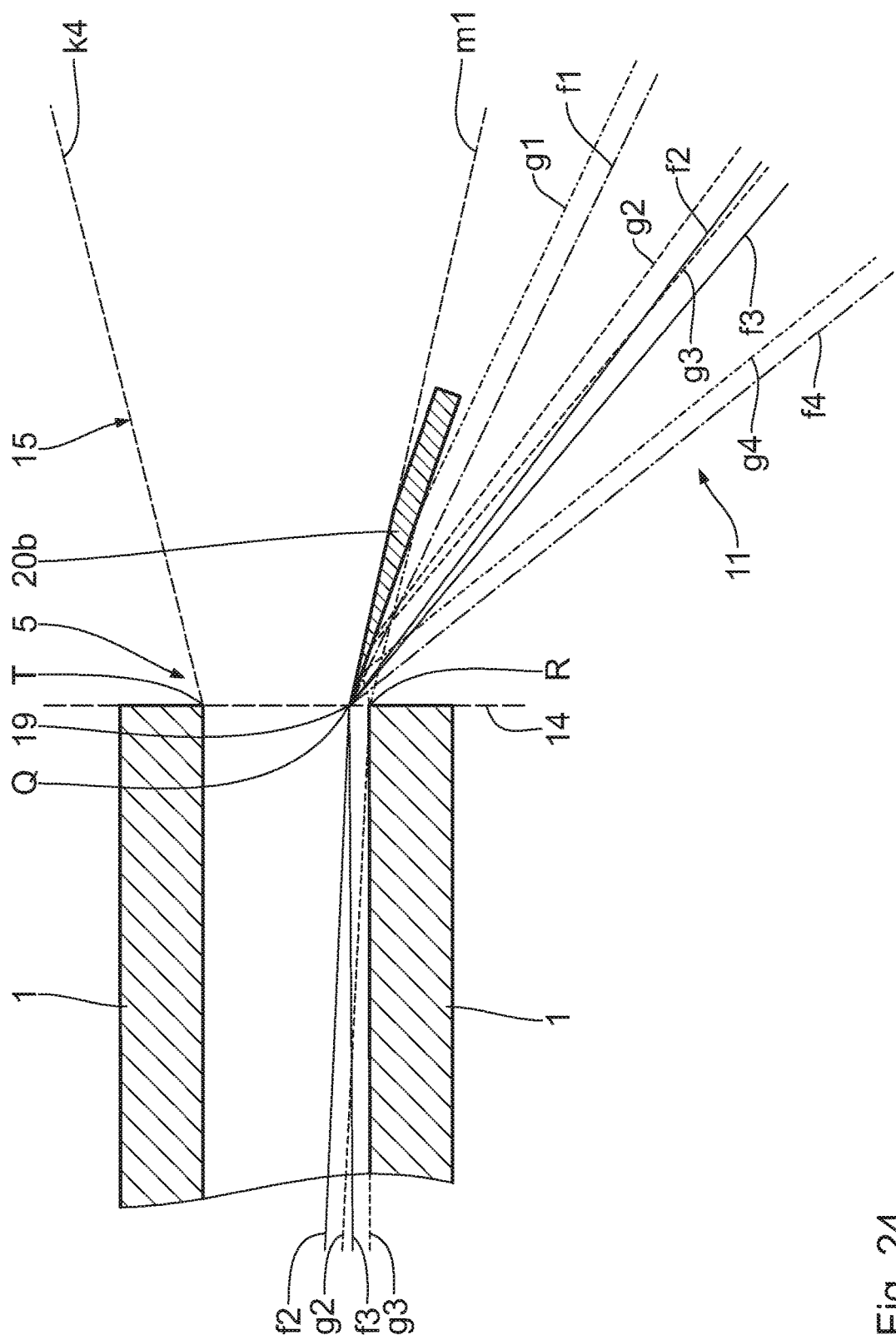
Figure 25:
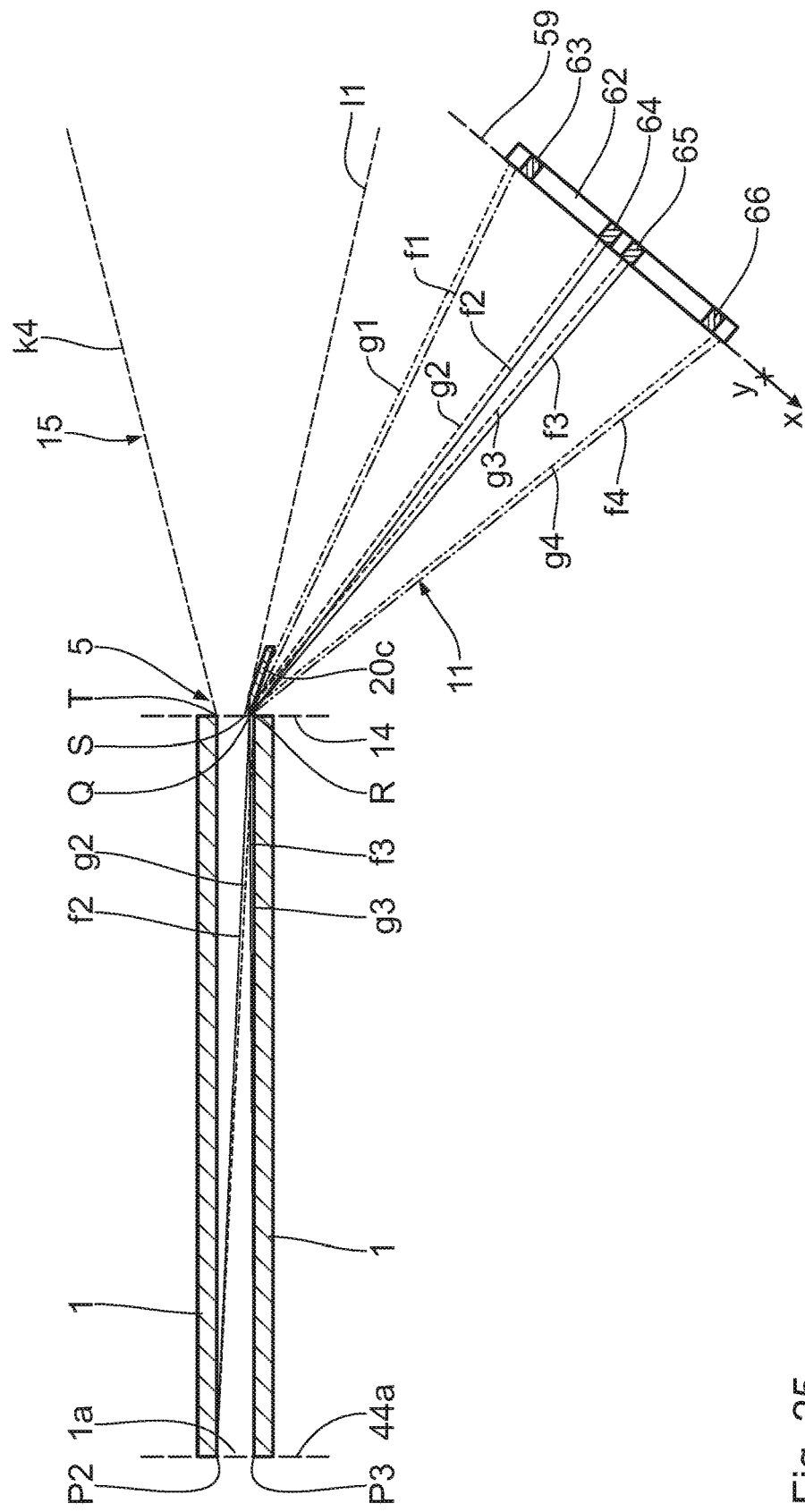
Figure 26:
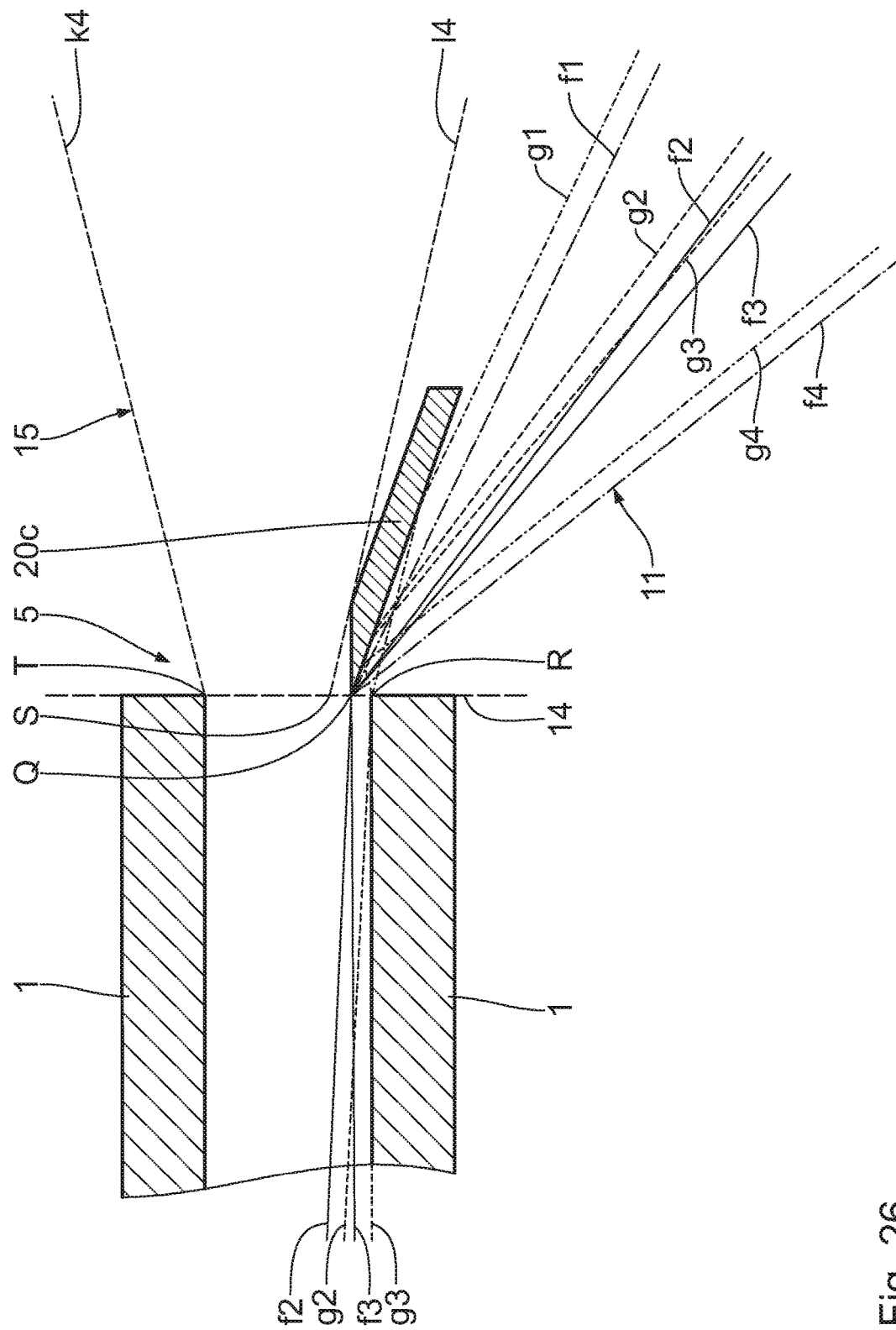
Figure 27:
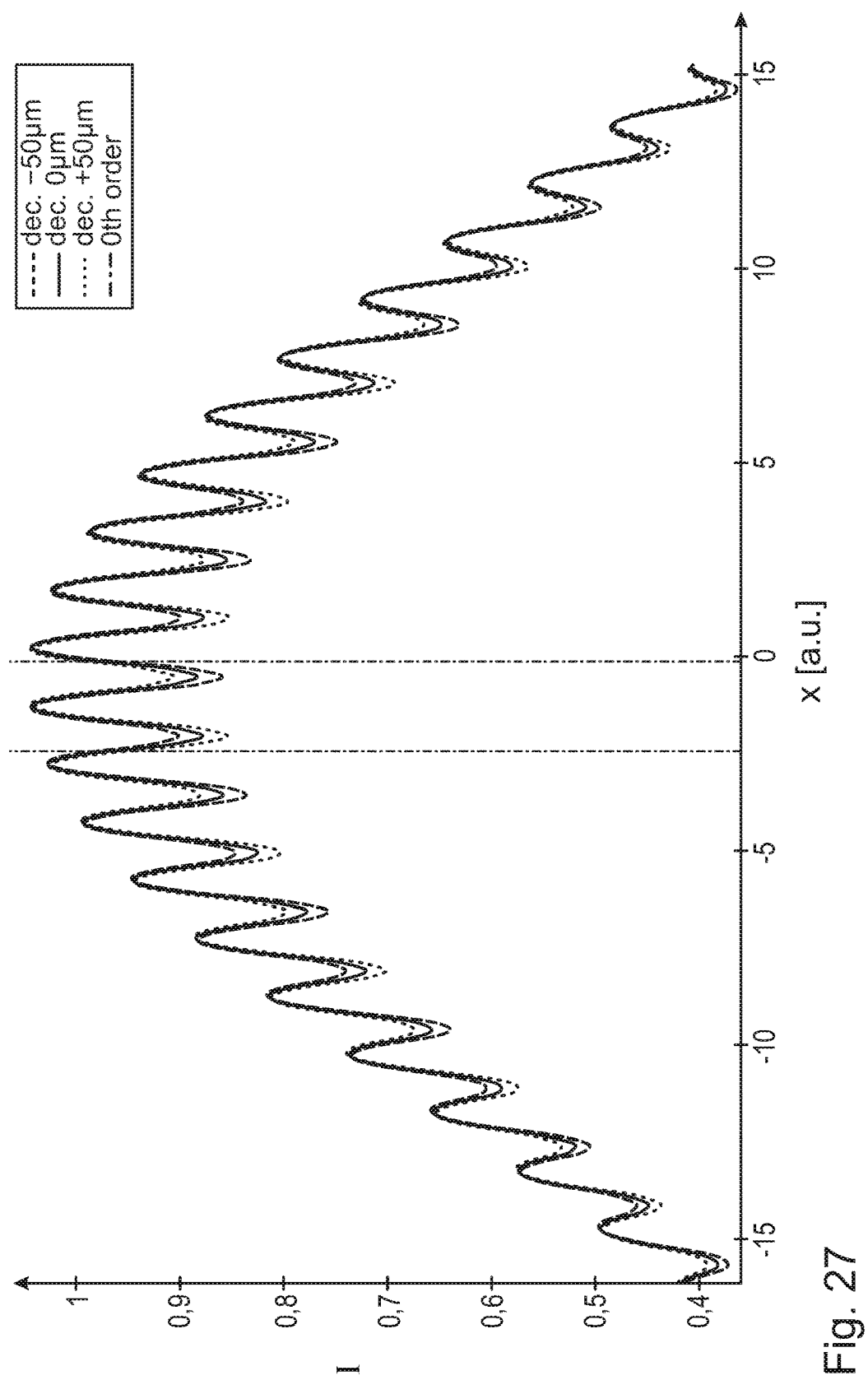
Figure 28:
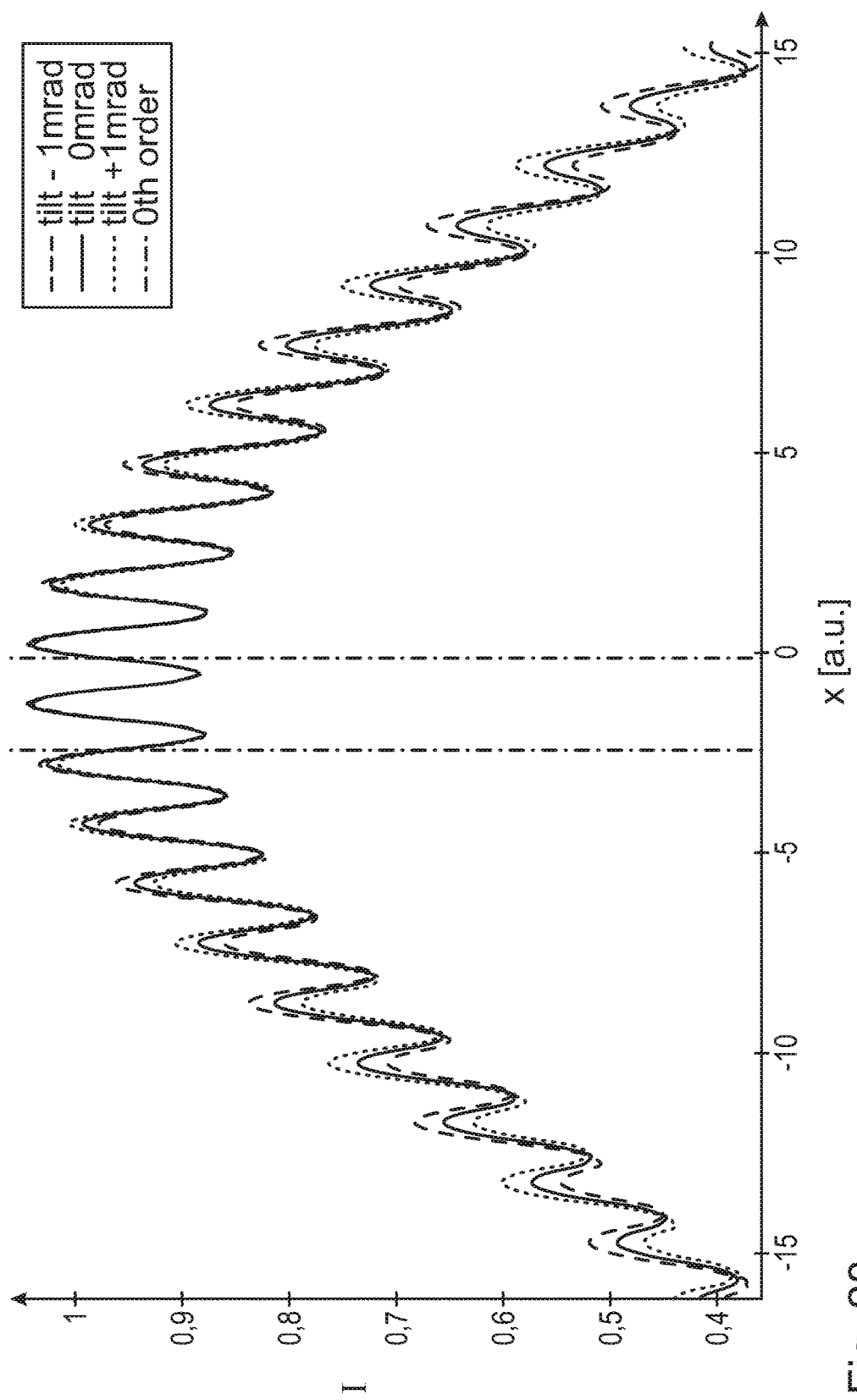
Figure 29:
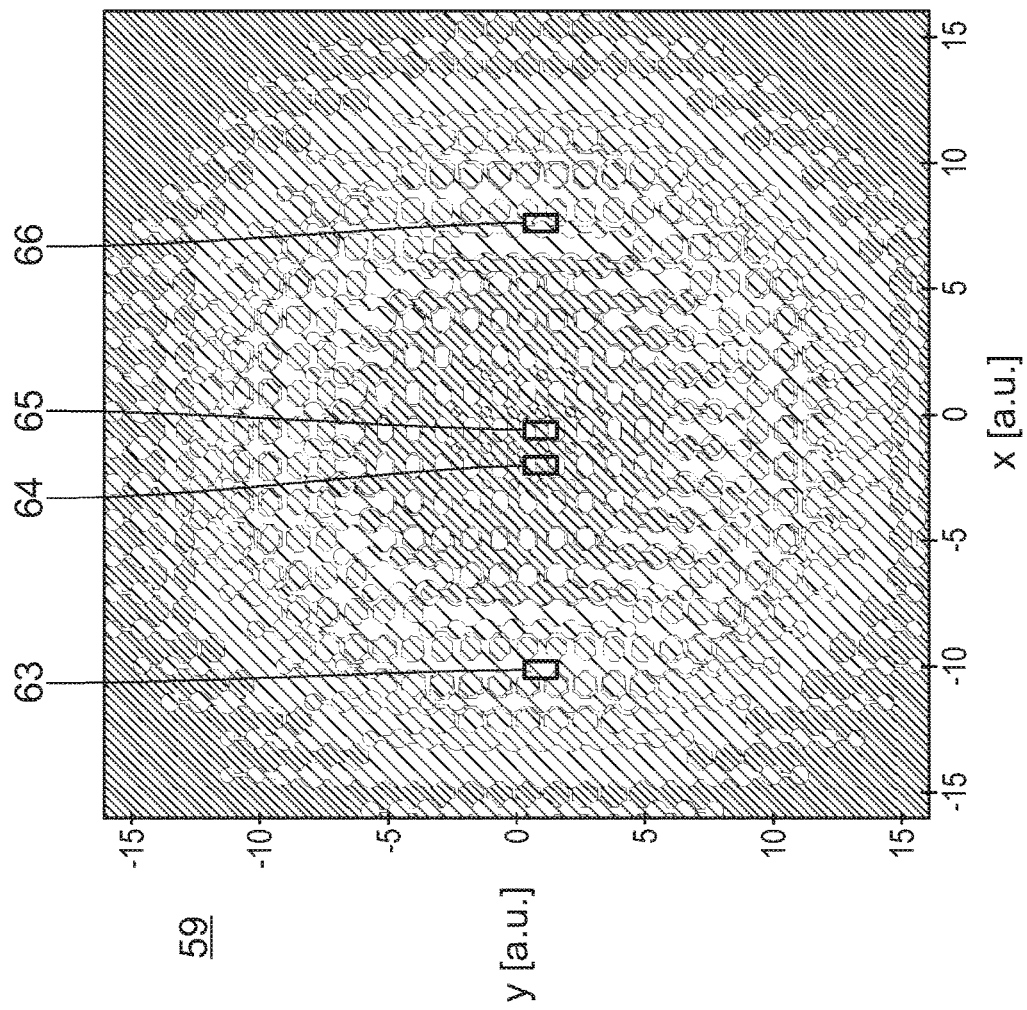
Figure 30:
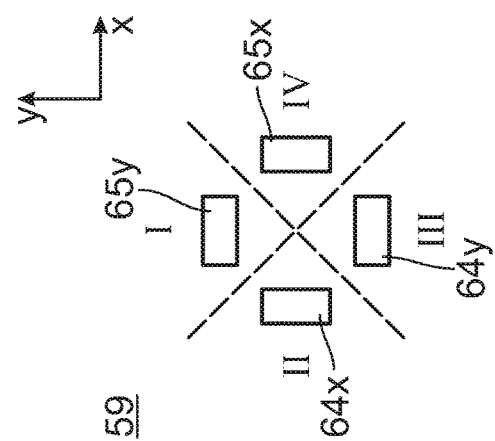
Figure 31:
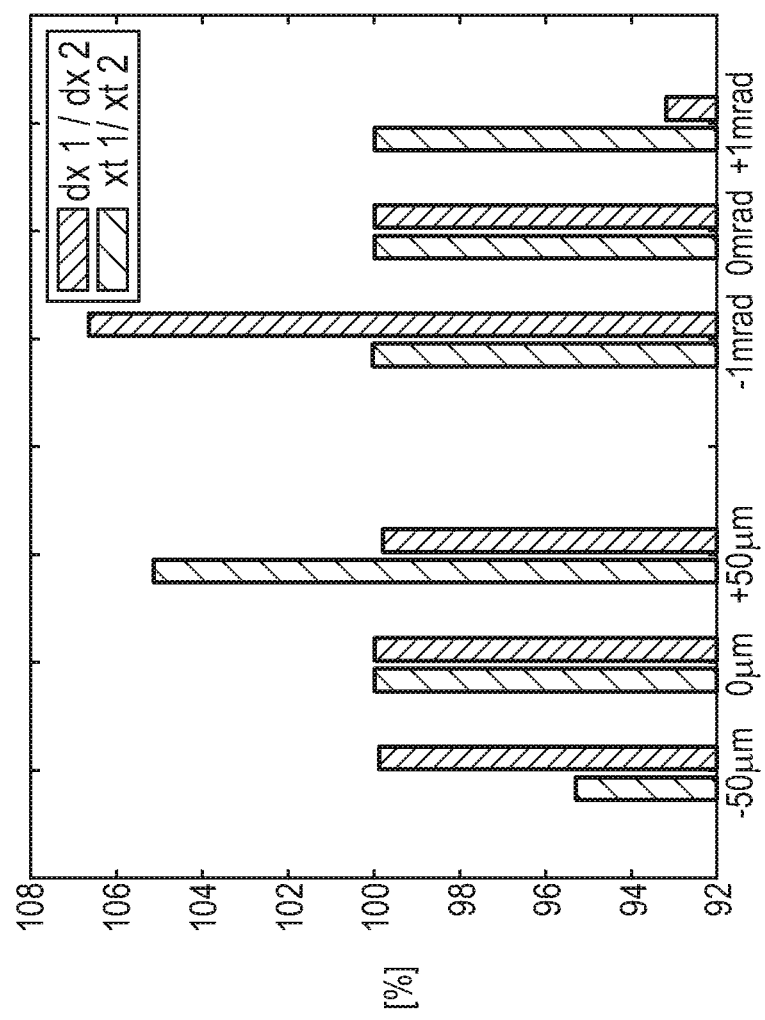
Figure 32:
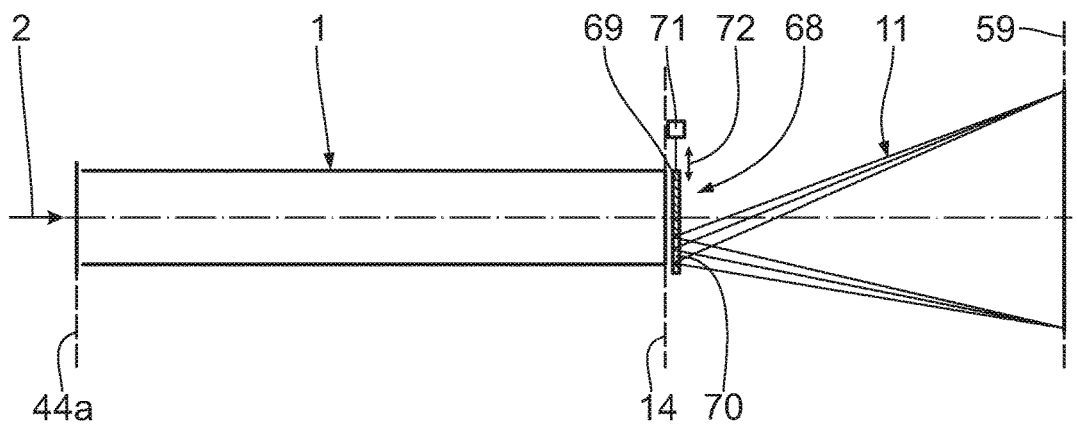
Figure 33:
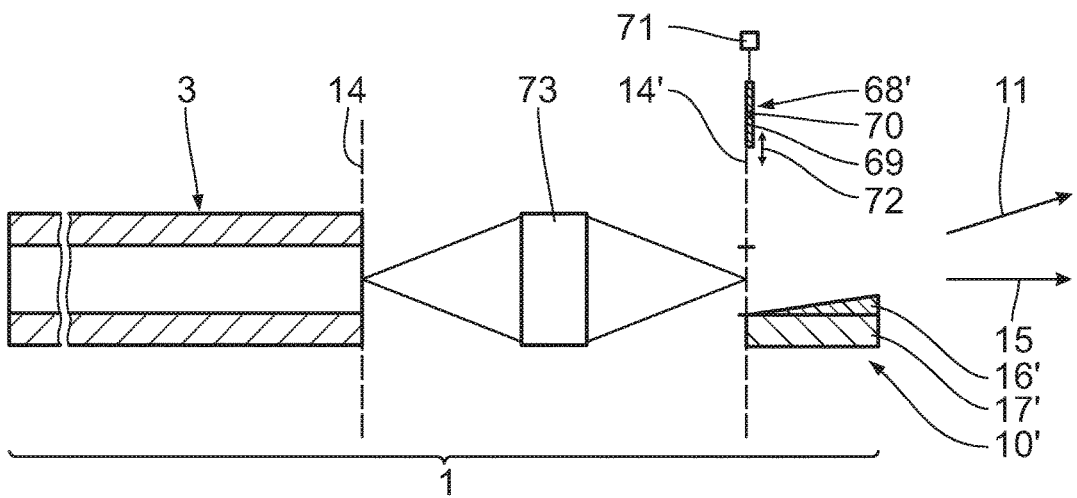
Figure 34:
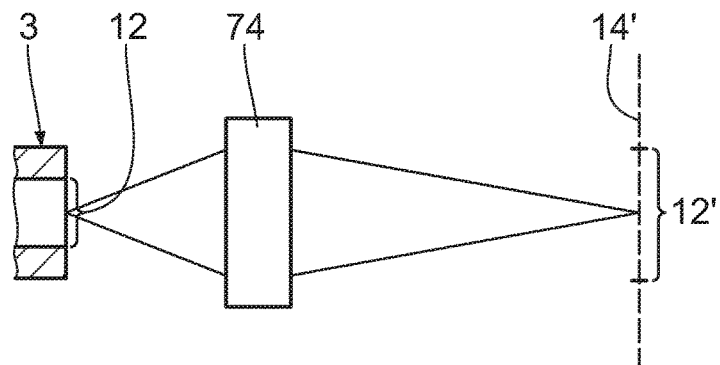

FIG. 15 schematically shows a scanning relative movement of an object field illuminated in sections and coinciding there with the illumination field, relative to an inspection object to be illuminated, for example a lithography mask;

FIG. 16 schematically shows a mask inspection apparatus comprising the waveguide as part of an illumination optical unit;

FIG. 17 schematically shows the waveguide according to FIG. 1 including beam guiding of the coupling-out partial beam into a detection plane of a detection device for monitoring the dose of the illumination light upon entering into the hollow waveguide;

FIG. 18 highly schematically shows one embodiment of the waveguide with beam guiding of an illumination light partial beam into a detection plane of a detection device (not illustrated) for ascertaining a decentration and a tilt of an illumination light beam upon entering into the waveguide;

FIG. 19 likewise schematically shows one embodiment of the waveguide with a simplified beam path for illustrating the beam path of an illumination light partial beam through to the detection device for ascertaining the decentration and the tilt;

FIG. 20 shows, in an illustration similar to FIG. 19, the waveguide including a coupling-out device for coupling out the coupling-out illumination light partial beam and the detection device for ascertaining the decentration and tilt;

FIG. 21 shows an enlarged excerpt from FIG. 20 in the exit region of the waveguide;

FIG. 22 shows, in an illustration similar to FIG. 21, a further embodiment of a coupling-out device with additionally depicted detection device for ascertaining the decentration and the tilt;

FIG. 23 shows, in an illustration similar to FIG. 20, a further embodiment of beam guiding of the coupling-out illumination light partial beam through to the detection device for ascertaining the decentration and the tilt with a further embodiment of a coupling-out device;

FIG. 24 shows an enlarged excerpt from FIG. 23 in the exit region of the waveguide;

FIG. 25 shows, in an illustration similar to FIG. 20, a further embodiment of beam guiding of the coupling-out illumination light partial beam through to the detection device for ascertaining the decentration and the tilt with a further embodiment of a coupling-out device;

FIG. 26 shows an enlarged excerpt from FIG. 25 in the exit region of the waveguide;

FIG. 27 shows a diagram of a location dependence of an intensity of the coupling-out partial beam against a coordinate x spanning the detection plane, integrated over the other coordinate y spanning the detection plane, plotted for different intermediate focus decentrations;

FIG. 28 shows, in an illustration similar to FIG. 27, the location dependence of the intensity of the coupling-out partial beam for different tilts of the intermediate focus at the waveguide entrance;

FIG. 29 shows a two-dimensional intensity distribution of the coupling-out partial beam in the detection plane, sensor positions for decentration and tilt sensors being highlighted;

FIG. 30 schematically shows an alternative arrangement of sensor positions for decentration sensors;

FIG. 31 shows, in a histogram illustration, signal ratios of decentration and tilt sensor pairs for different decentration and tilt values of the intermediate figures at the waveguide entrance;

FIG. 32 shows, in an illustration similar to FIG. 18, a further embodiment of the waveguide, in which a coupling-out illumination light partial beam is coupled out via a displaceable stop;

FIG. 33 shows, in an illustration similar to FIG. 1, a further embodiment of a hollow optical waveguide with a coupling-out device for a coupling-out illumination light partial beam, the coupling-out device being arranged in a coupling-out plane that is optically conjugate with respect to an exit plane of the illumination light from the hollow waveguide, wherein the exit plane is imaged into the coupling-out plane via an imaging optical unit; and FIG. 34 shows a further embodiment of the imaging optical unit for an optical waveguide of the type in FIG. 33, wherein the imaging optical unit images the exit plane into the coupling-out plane with a magnification factor of greater than 1.

FIG. 1 shows one embodiment of an optical waveguide 1 for guiding illumination light 2. The waveguide 1 according to FIG. 1 is a hollow waveguide. The waveguide 1 has a waveguide main body 3 for guiding the illumination light 2 between a main body entrance region 4 and a main body exit region 5.

The illumination light 2 is illustrated only highly schematically upon entering into the main body 3. The main body 3 is illustrated in an interrupted manner between the entrance region 4 and the exit region 5.

In the case of the hollow waveguide configuration of the waveguide 1, the main body 3 is embodied as a tubular main body having a continuous waveguide cavity 6 with an internal reflective inner wall 7. A cross-sectional area of the waveguide cavity 6 can be square or rectangular. A rectangular cross section of the waveguide cavity perpendicular to a longitudinal extent of the waveguide 1 can have cross-sectional dimensions in the range of between 0.2 mm and 20 mm. Cross-sectional areas of, for example, 0.2 mm×0.2 mm, of 2 mm×10 mm or of 20 mm×20 mm are therefore possible. Other cross-sectional area forms of the waveguide cavity 6 are also possible, for example those illustrated in FIG. 3 of U.S. Pat. No. 6,552,846.

A total length of the waveguide main body 3 between the entrance region 4 and the exit region 5 can be in the range of between 50 mm and 1000 mm and can be 500 mm, for example. The main body 3 can be designed for a maximum number N of reflections at the inner wall 7 in the range of between N=5 and N=100. By way of example, N=10 can hold true. For a given number of reflections N, this results in an angle $\alpha$ of acceptance between a parallel to the longitudinal axis 8 of the main body 3 and a marginal ray 9 of the illumination light 2 upon entering into the entrance region 4 or upon emerging from the exit region 5, for which angle $\alpha=2.3°$ holds true in the example shown. For entrance angles higher than the angle of acceptance, a larger number of reflections N ensues.

The waveguide 1 has a coupling-out device 10 in the main body exit region 5. Via the coupling-out device 10, a coupling-out illumination light partial beam 11 is coupled out from the emerging illumination light 2. A cross section of the coupling-out illumination light partial beam 11 constitutes a part of a cross section 12 of the illumination light 2 emerging overall from the waveguide main body 3. FIG. 1 shows by way of example a plurality of individual rays 13 of the coupling-out illumination light partial beam 11 which leave an exit plane 14 of the main body 3 at exit angles having maximally the absolute value of the angle $\alpha$ of acceptance.

The coupling-out illumination light partial beam 11 can have a coupling-out cross section which can be 20% of the cross section 12 of the illumination light 2 emerging overall from the waveguide main body 3, but which can also be smaller, for example less than 15%, less than 10%, less than 5% or else an even lower percentage of the cross section 12 of the illumination light emerging overall from the waveguide main body 3. In principle, in particular in the case of a plurality of coupling-out illumination light partial beams coupled out, a total coupling-out cross section, that is to say—in the case of a plurality of coupling-out illumination light partial beams—a sum of the cross sections of these partial beams, can also be greater than 20% of the cross section of the illumination light 2 emerging overall and can be, for example, 30%, 40% or 50% of this total cross section or can even be greater still.

The coupling-out device 10 couples the coupling-out illumination light partial beam 11 out from the rest of an emerging illumination light beam 15 such that the coupling-out illumination light partial beam 11 can be separated from the rest of the illumination light beam 15. In the case of the embodiment of the coupling-out device 10 according to FIG. 1, such a separation is possible starting from a distance L of the emerging illumination light 2 from the coupling-out device 10. The distance L can be less than half the length of the waveguide main body 3, can be less than ¼ or else can be less than ¹⁄₁₀ of the length of the waveguide main body 3. Depending on the angle β of incidence, it is possible to predefine the length L starting from which a separation of the coupling-out illumination light partial beam 11 from the rest of the illumination light beam 15 is possible.

The coupling-out device 10 has a coupling-out mirror 16, which is connected to the waveguide main body 3 via a mirror carrier 17 in the main body exit region 5. A mirror surface 18 of the coupling-out mirror 16 faces the rest of the illumination light beam 15. The mirror surface 18 is plane. The mirror surface 18 of the coupling-out mirror 16 is operated with grazing incidence with an angle β of incidence that is greater than 70° and in the embodiment illustrated is approximately 86°. The angle β of incidence holds true for an individual ray 13 passing through the exit plane 14 perpendicularly.

The coupling-out mirror 16 is embodied as a wedge plate connected to the parallelepipedal mirror carrier 17 via an adhesive layer 19a, for example. Other techniques for connection between the coupling-out mirror 16 and the mirror carrier 17 are also possible. The mirror carrier 17 is also correspondingly connected to the waveguide main body 3. A wedge vertex 19 of the wedge-shaped coupling-out mirror 16 coincides with the exit plane 14. Alternatively, the wedge vertex 19 can also be spaced apart from the waveguide main body 3.

FIG. 2 shows a further embodiment of the waveguide with a variant of a coupling-out device 20. Components and functions corresponding to those which have already been explained above with reference to the embodiment according to FIG. 1 bear the same reference numerals and will not be discussed in detail again.

In contrast to the coupling-out device 10, in the case of the coupling-out device 20 according to FIG. 2, the coupling-out mirror 16 and the mirror carrier 17 are combined to form a monolithic mirror/carrying body 21. Otherwise, the coupling-out device 20 according to FIG. 2 corresponds to the coupling-out device 10 according to FIG. 1. In a variant that is not illustrated, the mirror carrier 17 can also be monolithically connected to the waveguide main body 3.

FIGS. 3 and 5 show a further variant of a coupling-out device 22. Components and functions corresponding to those which have already been explained above with reference to the explanations according to FIGS. 1 and 2 bear the same reference numerals and will not be discussed in detail again.

The coupling-out device 22 according to FIGS. 3 and 5 also has a wedge-shaped coupling-out mirror. The coupling-out mirror constitutes a main component of the coupling-out device 22. A mirror surface 23 of the coupling-out mirror 22 faces away from the rest of the illumination light beam 15. The coupling-out device 22 is fashioned in the form of a cutting edge, wherein the wedge vertex 19 of the wedge-shaped coupling-out mirror 22 once again lies in the exit plane 14. The coupling-out mirror 22 is carried by the main body 3 of the waveguide 1 in a manner not illustrated.

In the case of the embodiment of the coupling-out device 22 according t FIG. 3 and FIG. 5, a separation of the coupling-out illumination light partial beam 11 from the rest of the illumination light beam 15 is possible directly downstream of the coupling-out mirror 22.

FIGS. 4 and 6 show a further embodiment of a coupling-out device 24. In contrast to the coupling-out device 22 according to FIG. 3 and FIG. 5, a rear wall 25 facing the rest of the illumination light beam 15 is not embodied in a plane fashion, but rather has, in a manner adapted to the angle α of acceptance, an inclined wall section 26. As a result, a larger cross section of the usable rest of the illumination light beam 15 is available in the exit plane 14, since less illumination light of the rest of the illumination light beam 15 is obstructed by the rear wall 25.

A further embodiment of the waveguide 1 is described below with reference to FIG. 7. Components corresponding to those which have already been explained above with reference to FIGS. 1 to 6, and in particular with reference to FIG. 3, bear the same reference numerals and will not be discussed in detail again.

In the case of the embodiment according to FIGS. 7 to 13, a waveguide main body 27 is fashioned as a solid body that is transparent or transmissive to the illumination light 2. The illumination light 2 is therefore guided in the main body 27 via internal reflection at a cladding wall 28 of the main body 27. In this case, an angle of reflection at the cladding wall 28 is above the critical angle of total reflection at the interface 28 with the optically less dense medium. As an alternative to a total internal reflection at the optically less dense medium, a reflection at the interface 28 can also be achieved via a reflective coating of the interface 28. A dielectric or metallic reflective coating can be used in this case.

The illumination light is coupled out from a coupling-out surface 29 lying in the exit plane 14. The coupling-out surface 29 can bear an antireflection coating for the illumination light 2.

In the case of the waveguide 1 according to FIG. 7, the coupling-out device 22 is embodied like that according to FIGS. 3 and 5. The wedge vertex 19 of the wedge-shaped coupling-out mirror 22 bears against the coupling-out surface 29.

FIGS. 8 and 9 show a further embodiment of the waveguide 1 comprising a waveguide main body 27 according to FIG. 7 and a coupling-out device 24 corresponding to that according to FIGS. 4 and 6.

FIG. 10 shows a further embodiment of a waveguide 1 comprising a main body 27 corresponding to that according to FIGS. 7 to 9. As coupling-out device, the waveguide 1 according to FIG. 10 has a coupling-out mirror 30 in the form of a 90° deflection mirror that deflects the coupling-out illumination light partial beam 11 by 90° after the partial beam emerges from the coupling-out surface 29. A mirror surface 31 of the coupling-out mirror 30 faces away from the rest of the illumination light beam 15.

A further embodiment of the waveguide 1 is described with reference to FIG. 11. Components and functions corresponding to those which have already been explained above with reference to FIGS. 1 to 10, and in particular to FIG. 10, bear the same reference numerals and will not be discussed in detail again.

In the case of the waveguide 1 according to FIG. 11, the coupling-out device is embodied as a prism attachment 32, which is optically coupled to a section of the coupling-out surface 29. The prism attachment 32 can be wrung for example onto the coupling-out surface 29 of the waveguide main body 27. Some other, refractive-index-matched connection technique for connecting the prism attachment 32 to the main body is also possible. As illustrated in FIG. 11, the prism attachment 32 has a cross section in the form of an isosceles right-angled triangle. A hypotenuse prism wall 33 of the prism attachment 32 is embodied as a reflection surface for the illumination light 2 at the optically less dense medium. The coupling-out illumination light partial beam 11 is coupled out as a result of total internal reflection at this reflective prism wall 33. Alternatively, here as well a reflective coating of the prism wall 33 is possible, for example a dielectric or metallic coating. The prism attachment 32 acts, in a manner similar to the coupling-out mirror 30, as a 90° deflection element for the coupling-out illumination light partial beam 11. An exit surface 34 of the prism attachment 32 can once again bear an antireflection coating for the illumination light 2.

Figure 12:
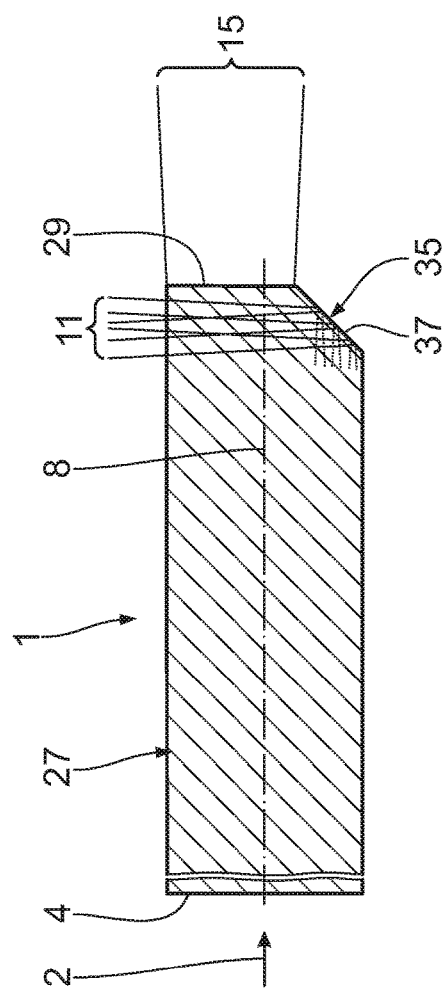
Figure 13:
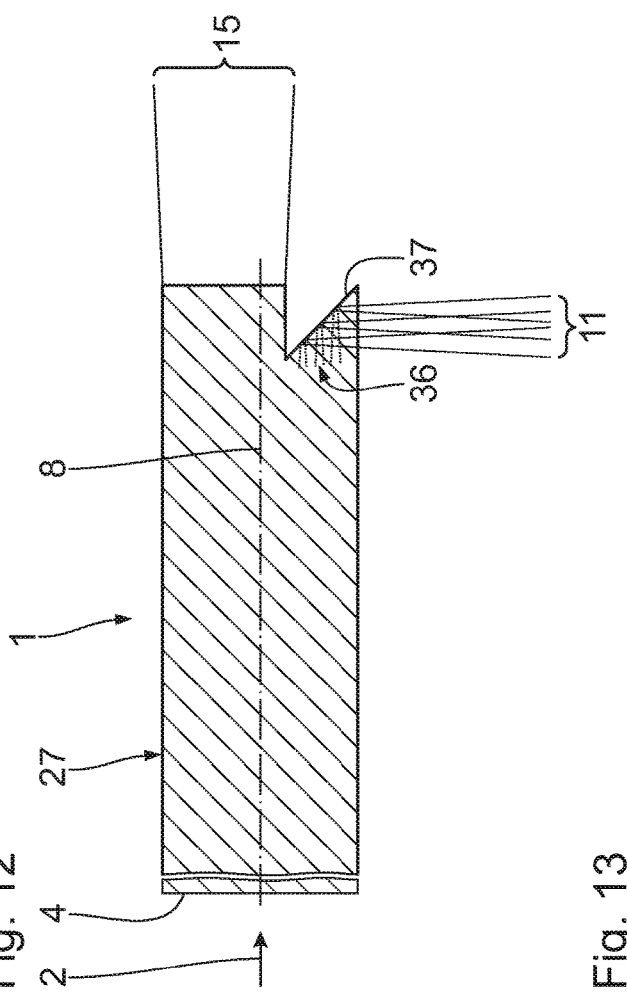

FIGS. 12 and 13 show further embodiments of prism attachments 35, 36 as coupling-out devices for coupling out the coupling-out illumination light partial beam 11.

The prism attachments 35, 36 are integrally, that is to say monolithically, connected to the waveguide main body 27. In the case of the prism attachment 35 according to FIG. 12, a prism wall 37 that is partly reflective and partly has a coupling-out effect for the coupling-out illumination light partial beam 11 is embodied with a 45° inclination opposite to that of the embodiment according to FIG. 11, such that, unlike in the case of the embodiment according to FIG. 11, a portion of the coupling-out illumination light partial beam 11 that is reflected at the prism wall 37 according to FIG. 12 crosses a light path of the rest of the illumination light beam 15 coupled out through the coupling-out surface 29 before the illumination light beam is coupled out.

The prism wall 37 of the prism attachments 35, 36 need not be embodied as fully reflective. A further portion of the coupling-out illumination light partial beams 11, the further portion being transmitted through the prism wall 37, can then in turn be separated, after the coupling-out, from the rest of the illumination light beam 15, for example via an additional deflection mirror (not illustrated), this not being illustrated in FIGS. 12 and 13.

With regard to the reflective effect of the prism wall 37, the embodiment according to FIG. 13 corresponds to the embodiment according to FIG. 11 with the prism wall 33. In the case of the embodiment according to FIG. 13, too, the prism wall 37 can be embodied as either fully reflective or partly reflective and partly transparent.

The optical surfaces used for coupling out in the different variants described in connection with the exemplary embodiments can be embodied not only as plane surfaces, as illustrated in the drawings, but also as curved surfaces which also have a beam shaping effect in addition to a coupling-out or deflecting effect. A curvature of the surfaces can be used, for example, for imaging or focusing the coupled-out light onto a sensor. In this case, the curved surface can constitute such an imaging or focusing optical unit by itself or can be part of a corresponding imaging or focusing optical unit.

As an alternative to the mirror or prism configurations described, a coupling-out element of the coupling-out device for coupling out the coupling-out illumination light partial beam 11 can also comprise at least one lens element and/or at least one diffractive optical element. Alternatively or additionally, a plurality of mirrors and/or a plurality of prisms can belong to the coupling-out device.

Figure 14:
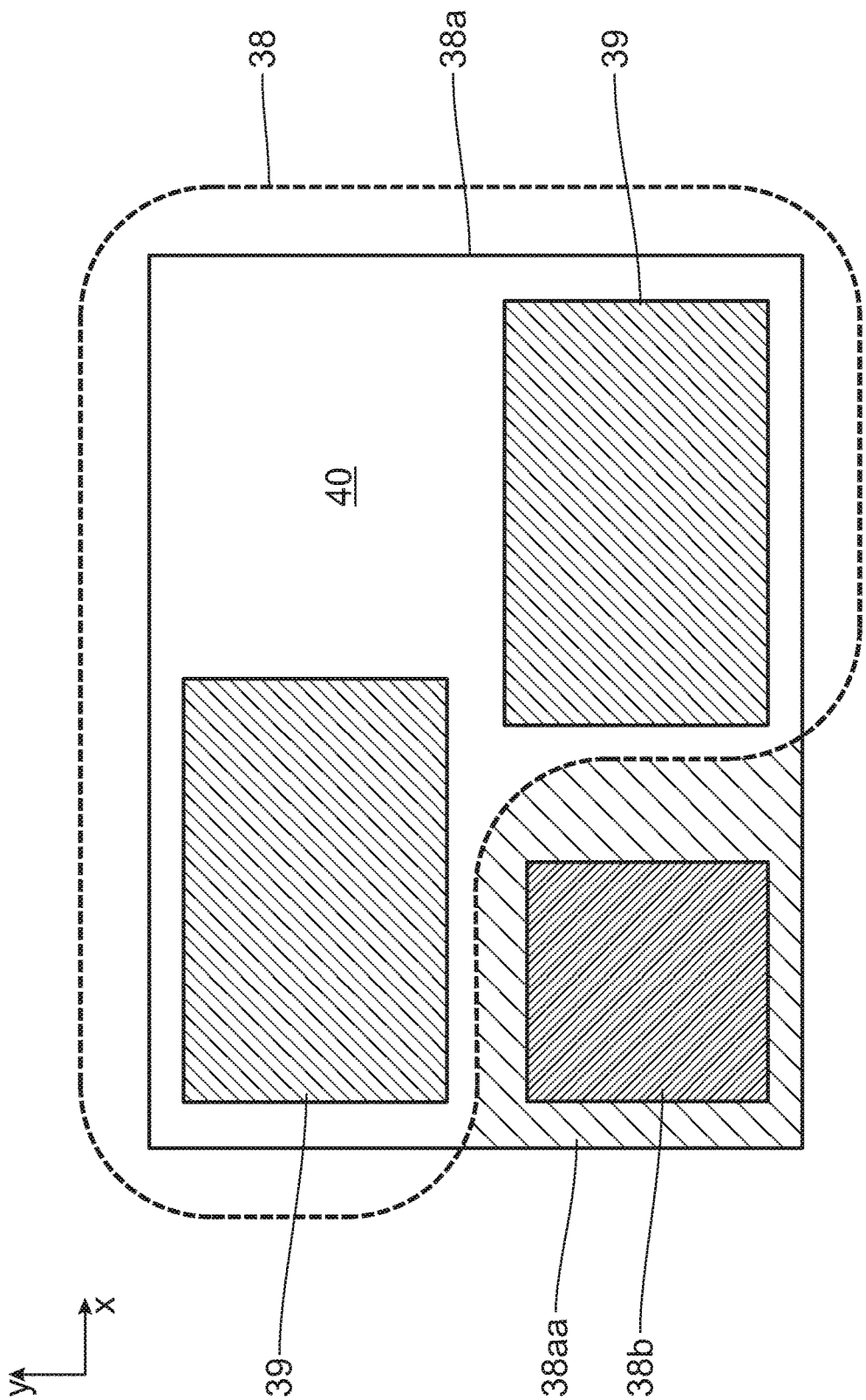
FIG. 14 shows an illumination field of the inspection apparatus with field regions used for the purpose of imaging for the inspection and unused field regions.

FIG. 14 shows by way of example and in a greatly enlarged view an illumination field 38 and an object field 38a in an object plane or illumination field plane 37a (cf. FIG. 16) of an inspection apparatus, in the illumination optical unit of which the waveguide 1 according to FIGS. 1 to 13 can be used.

The illumination field 38 is illuminated with the rest of the illumination light beam 15 that is not coupled out.

A section 38aa of the object field 38a is not illuminated with the rest of the illumination light beam 15, that is to say remains unilluminated. In the object field section 38aa, therefore, the illumination field 38 does not overlap the object field 38a.

The object field 38a and the illumination field 38 are described below in association with Cartesian coordinates x, y. The x-axis runs toward the right in FIG. 14. The y-axis runs upward in FIG. 14.

The object field 38a is rectangular. Where the illumination field 38 overlaps the object field 38a, the illumination field 38 goes beyond an edge region of the object field 38a both in the x-direction and in the y-direction. The object field 38a, where it is illuminated, is therefore illuminated with a certain excess.

A region 38b lying in the object field section 38aa corresponds to that portion of the illumination light 2 which is coupled out in order to generate the coupling-out illumination light partial beam 11.

The object field 38a has used field regions 39, which are imaged via a projection optical unit of a mask inspection apparatus that will additionally be explained below, and free field regions 40, which remain unused during the inspection. The used field regions 39 lie in the illuminated section of the object field 38a. In the case of the embodiment according to FIG. 14, two rectangular used field regions 39 are present in the illuminated section of the object field 38a. The use field regions 39 are spaced apart from one another and disjoint with respect to one another. The used field regions 39 are rectangular.

The above-described coupling-out devices of the waveguides 1 according to FIGS. 1 to 13 are fashioned such that depending on a predefined arrangement of the object field 38a required for scanning within an illumination field that can be illuminated overall by the entire illumination light 2, or depending on a predefined arrangement of used field regions 39 to be scanned and free field regions 40 in the illumination field 38, the coupling-out devices couple out a corresponding cross-sectional region of the illumination light 2 which would contribute to the illumination without coupling-out, as the coupling-out illumination light partial beam 11. The rest of the illumination light beam 15 then continues to illuminate the used field regions 39. Other, adjacent regions (cf. the object field section 38aa in FIG. 14) that would be illuminated in the object field 38a without the coupling-out are not illuminated by the rest of the illumination light beam 15.

A total illumination field 38 that can be illuminated by the illumination light 2 without coupling-out can also be larger overall than an object field that is actually to be imaged. Illumination light 2 which, without coupling-out, illuminates such regions in the illumination field 38 which are larger than the object field to be imaged can be coupled out via one of the embodiments described above.

In principle, an inspection apparatus can image all regions of a component to be inspected, for example of a reticle, which is also designated as a mask, or of a wafer, which are of interest during the inspection. Such an inspection apparatus is often embodied such that a segment that is smaller in comparison with the surface to be inspected overall is inspected simultaneously. The object to be inspected, that is to say the reticle and/or the wafer, is then not imaged in one step, but rather in the context of a continuous or progressive displacement, in particular in the context of a scanning process. The entire surface to be imaged of the object to be inspected is scanned in this way. This is indicated schematically in FIG. 15, which schematically shows how the object field 38a whose used field regions 39, as explained above, are illuminated is scanned over an object to be inspected, for example a photomask 42. Both in the x-dimension and in the y-dimension, the object field 38a has an extent that is in each case only a fraction of the x- and y-extents of the photomask 42.

A corresponding, meandering scanning path 40a is indicated by an arrow in FIG. 15.

FIG. 16 schematically shows a mask inspection apparatus 41 for inspecting the photomask 42, which is also designated as reticle and which is arranged in the illumination field 38. Components and functions which have already been explained above with reference to FIGS. 1 to 15 bear the same reference numerals and will not be disclosed in detail again.

The reticle 42 is carried by a reticle holder (not illustrated in more specific detail), which is in turn operatively connected to a reticle displacement drive (not illustrated). The reticle displacement drive provides for the progressive or scanning displacement of the reticle 42, as already explained above, during inspection. Examples of mask or reticle inspection apparatuses are known from DE 102 20 815 A1 and US 2012/0163698 A1. The inspection apparatus 41 has a light source 43 for generating the illumination light 2. The light source 43 can generate EUV used radiation in a wavelength range of between 2 nm and 30 nm, for example in the range of between 2.3 nm and 4.4 nm or in the range of between 5 nm and 30 nm. The light sources that are also customary for EUV lithography systems or projection exposure apparatuses, that is to say, for example, laser plasma sources (LPP; Laser Produced Plasma) or else discharge sources (DPP; Discharge Produced Plasma), are appropriate for the light source 43. Via a deflection mirror 44, which simultaneously has beam shaping properties, the illumination light 2 is coupled into the waveguide 1. The deflection mirror 44 generates an intermediate focus 45 in the region of an entrance plane 42a of the waveguide 1. The exit plane 14 of the waveguide 1 constitutes a field plane.

Downstream of the waveguide 1, the rest of the illumination light beam 15 is guided via an imaging optical unit 46 (illustrated schematically) through to the illumination field 38. In this case, the field plane 14 is imaged into the illumination field 38.

The imaging optical unit 46 together with the waveguide 1 constitutes part of an illumination optical unit of the inspection apparatus 41. The illumination optical unit is in turn an example of a downstream optical unit that uses the rest of the illumination light beam 15.

The used field regions 39 of the object field 38a are imaged into an image field 49 in an image plane 50 via a projection optical unit 48, which is likewise illustrated schematically. The image field 49 is detected by a detection device 51, e.g. by one CCD camera or a plurality of CCD cameras. The detection device 51 is present in a stationary fashion. The detection device 51 operates with image processing in such a way that it suffices if each object point on the reticle 42 is illuminated during the displacement relative to the used field regions 39 in the object field 38 and is imaged onto the detection device 51.

The coupling-out illumination light partial beam 11 is guided through to a dosimetry sensor as an example of a sensor device 52. The sensor device 52 is an example of a measuring device for detecting a measurement variable that is characteristic of the coupling-out illumination light partial beam 11. This can involve a pyroelectric sensor. The dosimetry sensor 52 together with the waveguide 1 can form an assembly. A sensor optical unit of the optical assembly can simultaneously be part of the coupling-out device.

The dosimetry sensor 52 ensures, during the mask inspection, that there are reproducible illumination conditions in the illumination field 38.

The dosimetry sensor 52 can be arranged such that it detects approximately the same angular distribution in a detection beam for the dosimetry sensor 52 as also the rest of the illumination light beam used for illumination. The detection beam additionally has a proportional intensity with respect to the rest of the illumination light beam.

The light source 43, the detection device 51 and the dosimetry sensor 52 can, in a manner not illustrated, be signal-connected to a central control/regulating device 53. Via the latter, by way of example, regulated packing of an output power of the light source 43 with the aid of the measurement signal of the dosimetry sensor 52 is possible. In this case, the dosimetry sensor 52 outputs a measurement signal correlated with an actual power of the light source 43. The actual power is compared with a predefined desired power in the control/regulating device 53. The control/regulating device 53 then drives the light source 43 depending on the deviation between the actual power and the desired power.

The inspection apparatus 41 makes it possible to inspect the structures on the reticle 42, for example, but also to check an imaging performance of the projection optical unit 48. Alternatively, the inspection apparatus 41 can also be embodied such that it can be used to check or monitor an illumination performance of an illumination optical unit in the illumination field 38. Such an illumination optical unit can be used not only during the inspection, but also during the projection exposure itself.

As an alternative or in addition to the dosimetry sensor 52, a field position sensor can be used, by which it is possible to detect the position of the illuminated illumination field in space. Such a field position sensor can be embodied as a spatially resolving sensor, for example as a quadrant sensor. For detecting a position on an illumination field plane, the field position sensor can be provided with a corresponding measuring optical unit. As an alternative or in addition to the dosimetry sensor, a pupil sensor can furthermore be used. The latter can likewise be fashioned as a spatially resolving sensor and measure an illumination angle distribution of an illumination of the illumination field.

Measurement variables ascertained via the sensor 52 that detects the coupling-out illumination light partial beam 11 can, via the control/regulating device 53, also be used for the driving of components of a projection exposure apparatus, for example of an object displacement drive of a reticle holder and/or of a wafer displacement drive of a wafer holder for a wafer onto which the reticle 42 is imaged, or else for the controlled displacement of at least one component of the light source 43 and/or of the illumination optical unit and/or of the projection optical unit 48.

An exemplary arrangement for the dosimetry sensor 52 is explained in detail more thoroughly below with reference to FIG. 17. The dosimetry sensor 52 is an example of a measuring device for detecting a measurement variable that is characteristic of the coupling-out illumination light partial beam. Components and functions corresponding to those which have already been explained above with reference to FIGS. 1 to 16 bear the same reference numerals and will not be discussed in detail again.

FIG. 17 shows an Embodiment of the waveguide 1 which consists a modification of the embodiment according to FIG. 2. The coupling-out mirror 20 is produced as a component separate from the main body 3 and bears with its mirror surface 18 against an edge of the main body exit region 5 of the waveguide 1. That section of the mirror surface 18 of the coupling-out mirror 20 which, after the edge, projects into the cross section 12 of the illumination light 2 couples the coupling-out illumination light partial beam 11 out of the illumination light 2, that is to say separates the coupling-out illumination light partial beam 11 from the rest of the illumination light 2 that is used for illuminating the used field regions 39, as explained above. The exit plane 14 is imaged into a stop plane 55 of the sensor device 52 with the aid of a sensor optical unit 54, which is formed by a concave mirror in the embodiment according to FIG. 17. A dosimetry sensor device 56 is arranged downstream of the stop plane 55, the dosimetry sensor unit being signal-connected to the central control/regulating device 53.

On account of the homogenizing effect of the waveguide 1, from an intensity measurement, performed by the dosimetry sensor unit 56, within only a small part of the illumination light beam in the exit plane 14 it is possible to deduce with high accuracy a total intensity of the illumination light 2 available in the exit plane 14. Preferably, the entire angular spectrum corresponding to a system aperture of the downstream optical unit is detected completely during the dose monitoring via the dosimetry sensor 52. At the same time, detecting a higher aperture, via the dosimetry sensor, than is required for the downstream optical unit, that is to say for example an illumination optical unit and/or a projection optical unit, should be avoided. This restriction to the system aperture of the downstream optical unit can be effected with the aid of an aperture stop 57, which is arranged near the concave mirror 54 in the embodiment according to FIG. 17. Alternatively, the system aperture detected via the dosimetry sensor unit 56 can be predefined by a size or form of components of the sensor optical unit 54 or of a reflective coating on the components. A further stop in the stop plane 55 ensures that rays of the coupling-out illumination light partial beams 11 through those points in the exit plane 14 from which only a part of the aperture of the sensor optical unit 54, which is defined for example by a stop 57 or in some other way as described above, is illuminated or not detected by the dosimetry sensor unit 56. This ensures that the coupling-out illumination light detected by the dosimetry sensor device 56 has the uncorrupted angular spectrum of the rest of the used illumination light beam 15, the angular spectrum being complete up to the aperture of the sensor optical unit 54. Insofar as the aperture of the sensor optical unit 54 corresponds to the system aperture of the downstream optical unit, therefore, the dosimetry sensor 52 measures exactly that dose of the illumination light 2 which is available via the system aperture.

Stops corresponding to the stop in the stop plane 55 can be dispensed with if, for example, as a result of the use of a coupling-out device according to FIGS. 3 to 9, the light rays coupled out in the coupling-out illumination light partial beam 11 have the complete uncorrupted angular spectrum of the rest of the used illumination light beam 15. This is the case if the coupling-out illumination light partial beams 11 is separated directly in the exit plane 14. During the dosimetry measurement via the dosimetry sensor 52, exclusively illumination light whose angular spectrum corresponds to the rest of the illumination light beam 15 actually used can be detected for the dose measurement. Therefore, with regard to its angular spectrum, the illumination light used for the dose measurement does not deviate from the rest of the illumination light beam 15 actually used, and so dose measurement errors arising from a deviation in the angular spectrum cannot occur.

Various embodiments of a detection device 58 for ascertaining a decentration and a tilt of the illumination light 2 upon entering into the hollow waveguide 1 are described below with reference to FIGS. 18 to 26. The detection device 58 is an example of a measuring device for detecting a measurement variable that is characteristic of the coupling-out illumination light partial beam. Components and functions corresponding to those which have already been explained above with reference to FIGS. 1 to 16 bear the same reference numerals and will not be discussed in detail again.

The detection device 58 serves for measuring a relative position and a relative orientation of the intermediate focus 45 in the entrance plane 44a and of the waveguide 1 relative to the main body entrance region 4 of the waveguide 1. Upon entering into the entrance plane 44a, an intensity distribution of the illumination light 2 is Gaussian, both as far as the intensity distribution over the location is concerned and as far as an angular spectrum of the ray directions of the individual rays of the illumination light is concerned. In the region of the exit plane 14, the coupling-out illumination light partial beam 11 is coupled out in the region of a corner of the square rod exit surface or coupling-out surface. In this case, the coupled-out cross section of the coupling-out illumination light partial beams corresponds to one seventh of the extent of the rod exit surface in both dimensions of the rod exit surface. A coupling-out device has been omitted in FIG. 18. The illustration shows only the coupling-out illumination light partial beam 11, but not the rest of the illumination light beam 15.

A sensor (not illustrated in FIG. 18) of the detection device 58 is arranged in a detection plane 59. The detection plane 59 can be plane, as illustrated, but can also be curved, in principle. Correspondingly, a detection device 58 have a curved detector surface can therefore be used.

FIG. 19 shows further details of the beam path of the coupling-out illumination light partial beams 11 for coupling out for the detection device 58. In this case, once again only the coupling-out illumination light partial beam 11 is illustrated, for simplification. That portion of the illumination light 2 in the total cross section 12 in the exit plane 14 which is available for the rest of the illumination light beam 15 is designated by 12' in FIG. 19.

The points P2 and P3 constitute the entrance-side marginal points of the main body entrance region 4 in the plane of the drawing. A distance d, that is to say the distance between the points P2 and P3, denotes the entrance-side dimension of the waveguide cavity 6.

It is assumed below that only those individual rays of the illumination light 2 which pass to the exit region 5 of the waveguide 1 via at most four reflections at the inner wall 7 of the waveguide 1 contribute to the coupling-out illumination light partial beam 11. For the construction of the aperture marginal rays g1 and f4 in this region of the coupling-out illumination light partial beams 11, FIG. 14 depicts two further points P1 and P4, which are respectively situated at the distance 4d from the points P2 and P3 in the entrance plane 44a.

The points Q and R at the distance d1 with respect to one another delimit that region in the exit plane 14 through which the coupling-out illumination light partial beam 11 is coupled out. The waveguide 1 has the length A. f2 denotes the ray which passes from P2 through the point Q. f3 denotes the ray which passes from P3 through the point Q. g2 denotes the ray which passes from P2 through the point R.

g3 denotes the ray which passes from P3 through the point R. f1 denotes the ray through the point Q which, as seen from the point Q, apparently, that is to say without taking account of reflections, passes from P1 through the point Q. f4 denotes the corresponding ray from the point P4 through the point Q. g1 and g4 denote the corresponding rays through the points P1 and P4 and in each case through the point R.

The rays f2 and f3 delimit the angular range of the illumination light 2 which has passed from the entrance region 4 of the waveguide 1 as far as the point Q without reflection within the waveguide 1. This angular range is also designated as the zero order of reflection.

Insofar as the waveguide cavity has a rectangular cross section, in a sectional plane parallel to two of the parallelepiped faces delimiting the cavity 6, wherein the central axis 8 of the waveguide 1 through the cavity 6 lies in the sectional plane, for example in the plane of the drawing in FIG. 1 et seq., the following holds true:

Depending on the angular of the illumination light 2 with respect to the longitudinal axis 8 of the waveguide 1, the illumination light 2 has experienced a specific number n of reflections between the entrance region 4 and the exit region 8, starting from a specific entrance point, e.g. the entrance point P2. The number of the reflections is designated as the order of reflection. Illumination light 2 which is not reflected at all at the inner wall 7 of the waveguide 1 defines the zero order of reflection. Depending on whether the light is reflected "upward", that is to say for example in the positive x-direction in the coordinate system on the left in FIG. 17, or in the negative x-direction after emerging from the exit region 5, the +nth or −nth order of reflection arises depending on the number n of reflections.

Insofar as the y-dimension is additionally considered as well, the order of reflection is denoted with two indices, separately for the x-dimension and for the y-dimension. For a waveguide 1 having a square cross section of the waveguide cavity 6, this manner of action of a waveguide is described in U.S. Pat. No. 4,918,583. Alternatively, the waveguide 1 can also have a rectangular cross section or else a differently shaped cross section.

The rays f1 and f4 delimit the angular range whose light has passed from the entrance region 4 to the point Q via at most four reflections. The angular range therefore covers the orders of reflection −4 to +4.

Correspondingly, the rays g1 to g4 are assigned to the respective orders of reflection which pass through the point R.

h1 denotes a distance between the rays f3 and g3, or f2 and g2, in an observation plane 60, which runs parallel to the exit plane 14 and the distance of which from the exit plane 14 is designated by x in FIG. 19. h3 in the observation plane 60 is the distance between, for example, the rays g2 and g3, that is to say the distance between the rays which pass through the same points Q or R and which proceed from P2, on the one hand, and P3, on the other hand.

FIGS. 20 and 21 extend the above description by a coupling-out device of the type of the coupling-out device 20 according to FIG. 2. Components and point and ray designations which have already been described above with reference to FIG. 19 bear the same reference designations and will not be discussed in detail again.

Points S and T delimit a region of the cross section 12 which is available for the passage of the rest of the illumination light beam 15. The rest of the illumination light beam 15 is delimited by the marginal rays 11 and k4, once again in the angular spectrum range of the orders of reflection −4 and +4, as already explained above with reference to FIG. 19. These marginal rays, delimiting the angular spectrum, have a smaller aperture angle in comparison with the marginal rays g1 and f4 according to FIG. 19. This is owing to the fact that, in the case of the waveguide 1 according FIG. 20, the ratio between a cavity cross section of the waveguide 1 and a length of the waveguide 1 is smaller in the case of the embodiment according to FIG. 20 than in the case of the embodiment according to FIG. 19.

In the case of the embodiment according to FIG. 20, a stop body 61 is situated between the point S, that is to say a boundary of the rest of the illumination light beam 15 lying in the exit region 5, and the point Q, the adjacent boundary of the coupling-out illumination light partial beams 11 in the exit plane 14. Without this stop 61 between the points Q and S in the exit plane 14, the illumination light 2, depending on where it passes through the exit plane 14 in the exit region 5 of the waveguide 1 between the points Q and S, and depending on the direction of the respective individual ray, would partly carry on in the forward direction with the rest of the illumination light beam 15, that is to say mix therewith, or would partly be incident on the mirror surface 18 (cf. FIG. 21) of the coupling-out device 20 and mix with the coupling-out illumination light partial beam 11. Such mixed light that would be generated without the stop body 61 is undesired.

The aim of guiding the coupling-out illumination light partial beams 11 into the detection plane 59 is to generate there an image of the intensity distribution of the illumination light 2 in the entrance plane 44a of the waveguide 1, wherein there are associated with the image various original images of the intensity distribution of the illumination light at the entrance of the waveguide 1, which appear offset with respect to one another depending on the order of reflection in the detection plane 59. This imaging of the orders of reflection is described in detail more thoroughly in U.S. Pat. No. 4,918,583.

The superimposition of the different orders of reflection in the Detection plane 59 leads to a modulation of an intensity distribution. This can be used for ascertaining the decentration and the tilt of the illumination light 2 in the entrance region 4, as will be explained below.

A spatially resolved detector 62 is arranged in the detection plane 59. The detector 62 can be a CCD camera. The detector 62 is signal-connected to the central control/regulating device 53.

In FIG. 20, for sensor regions 63, 64, 65 and 66 are highlighted, the significance of which will be explained below.

FIG. 22 shows a variant of a coupling-out device 20a which can be used instead of the coupling-out device 20 according to FIGS. 19 and 20. Components and point and ray designations corresponding to those which already been explained above with reference to FIGS. 1 to 21, and in particular with reference to FIGS. 19 to 21, bear the same reference designations and will not be discussed in detail again.

The coupling-out device 20a has a curved mirror surface 18. This has the effect that the entrance plane 44a is imaged with pinpoint accuracy in the detection plane 59. Such an imaging can also be generated in a different way, for example via a plane coupling-out mirror and a downstream Fourier optical unit.

With reference to FIGS. 23 to 26, an explanation is given below of two embodiments of coupling-out devices 20b and 20c in which the coupling-out illumination light partial beams 11 is separated in each case exactly in the exit plane 14 and in which a stop body 61 in the exit plane 14 can be dispensed with.

The coupling-out devices 20b and 20c are similar to that according to FIG. 4, for example. A mirror wedge having a wedge vertex 19 in the exit plane 14 is once again involved.

Practically the complete cross-sectional region between the wedge vertex 19 (point Q) and the upper boundary point T of the exit region 5 in FIGS. 23 to 26 is then available for the rest of the illumination light beam 15.

In this case, the coupling-out device 20b according to FIGS. 23 and 24 has a very small wedge angle in the region of the wedge vertex 19.

The coupling-out device 20c according to FIGS. 25 and 26 has a somewhat larger wedge angle, such that a region of the cross section 12 between points S and T is available for the rest of the illumination light beam 15, wherein a distance between the points S and Q (wedge vertex 19) in the exit plane 14 is small in comparison with the cross section 12.

The full angular spectrum corresponding to the aperture of the waveguide 1 is available at the location where the coupling-out illumination light partial beams 11 is coupled out.

FIG. 27 shows an illumination light intensity I, measured against the x-coordinate (also cf. e.g. FIG. 20) in the detection plane 59.

The detection plane 59 is spanned by cartesian coordinates x and y, which are depicted e.g. on the right in FIG. 20. The x-axis runs in the plane of the drawing in FIG. 20 and simultaneously in the detection plane 59. The y-axis runs perpendicularly to the plane of the drawing in FIG. 20 into the latter.

The detection plane 59 is near a plane in which a relative displacement r has a value that is less than 5.

r is the ratio between the distances h1 and h3 explained above in connection with FIG. 19. r=0 means a perfect overlap, i.e. rays which proceed from identical points in the entrance plane 44a including the virtual points (cf. P1, P4) chosen for the construction of the ray path of higher orders of reflection, impinge on the same point in the detection plane 59, independently of the point through which the rays pass in the exit plane 14. r=1 means that two rays which proceed from identical points in the entrance plane 44a including the virtual points (cf. P1, P4) chosen for the construction of the ray path of higher orders of reflection, but pass through the opposite boundaries Q and R of the coupling-out illumination light partial beams 11 in the exit plane 14, impinge on two different points in the detection plane 59, wherein these points have precisely the same distance as the impingement points of two rays which pass from the points P2 and P3 in the entrance plane through the same point R or Q. If the two regions in the detection plane 59 are considered which are illuminated by rays of the zero order of reflection which pass through the point Q and respectively through the point R in the exit plane 14, then the relative displacement indicates the offset of these two regions relative to the extent of these regions (which are approximately of the same size). The larger the relative displacement, the less sharp the image of the entrance plane 44a in the Detection plane 59.

The following formula can also be specified for the relative displacement r:

$$r = d1/d(1+A/x)$$

In this case, d1 denotes the distance between the points Q and R. Therefore, d1/d is the proportion constituted by the cross section coupled out in the exit plane 14 with respect to the total cross section 12 in the x-dimension. x denotes the distance to the detection plane 59 and the exit plane 14, and A denotes the length of the waveguide 1.

A first overlap is achieved at $x=\alpha/(1-\alpha)$ where $\alpha=d1/d$.

With the distance x=A, the following holds true: $r=2\alpha$.

With the distance $x \to \infty$, the following holds true: $r \to \alpha$.

The detection plane 59 is chosen such that r<1 holds true, preferably r<0.5, particularly preferably r<0.3.

A distance between the detection plane 59 and the exit plane 14 or a light path between these two planes can be in the range of between 50% and 200% of the length of the waveguide main body 3 and can be, in particular, of exactly the same length as the waveguide main body 3. Alternatively, the distance can also be less than 50% of the length of the waveguide main body or greater than 200% of the length of the waveguide main body.

In FIG. 27, the intensity I of the coupling-out illumination light partial beams 11 integrated in the y-direction is plotted in relative units.

In FIG. 27, the illumination intensity I is indicated for various decentration values of the intermediate focus 45 with respect to the center of the main body entrance region 4 of the waveguide 1. A decentration "0", that is to say a perfect centering of the intermediate focus 45 with respect to the main body entrance region 4, is illustrated by a solid line. A decentration "−50 μm" is illustrated by a dashed line. A decentration "+50 μm" is illustrated by a dotted line. These decentration values relate to deviations from the perfect centering in the x-direction. The cartesian xyz-coordinate system illustrated on the left e.g. in FIG. 17 is applicable with regard to these positional indications of the intermediate focus 45. The z-direction corresponds to the normal to the entrance plane 44a, that is to say to the untilted direction of propagation of the illumination light 2. The z-direction runs toward the right in FIG. 17. The x-direction runs upward in FIG. 17. The y-direction of the propagation coordinates of the illumination light 2 (left coordinate system in FIG. 17) runs parallel to the y-direction (right coordinate system in FIG. 17) over which the detection plane 59 is spanned, that is to say in FIG. 17 perpendicularly to the plane of the drawing into the latter.

The dependence of the illumination intensity against the x-coordinate corresponds to the angular dependence of the intensity of the coupling-out illumination light, that is to say of the coupling-out illumination light partial beams 11, in the exit plane 14 of the waveguide 1, wherein those x-coordinate values which delimit a zero order of reflection are highlighted by dash-dotted lines in FIG. 27. This range is larger than the distance between two maxima because the coupling-out illumination light of the zero order of reflection, depending on the point in the exit plane 14 through which it passes, impinges on the detection plane 59 at a slightly different location, as described in connection with the relative displacement r defined further above, with the result that that region of the detection plane 59 which is illuminated overall by light of the zero order of reflection is widened somewhat. From the profile of the three decentration curves in FIG. 27 it can be discerned by minima of the intensity distribution are influenced by the decentration.

The sign of the intensity influencing changes with the order of reflection. In the range between an order of reflection "N" and the order of reflection "N+1", for example the intensity curve "decentration −50 μm" has a lower minimum than the intensity curve "decentration +50 μm", whereas this is exactly reversed in the range between the order of reflection "N+1" and the order of reflection "N+2". Moreover, the sign of the minima influencing changes with the direction of the decentration. In the case of a specific reflection minimum, therefore, it is always possible to distinguish whether a decentration is effected in the positive or negative x-direction. In the range of orders of reflection that are small in absolute terms, the decentration dependence is greater than at higher orders of reflection.

FIG. 28 shows corresponding intensity distributions for various tilts of the intermediate focus 45 relative to the main body entrance region 4, that is to say relative to the entrance plane 44a. The tilt therefore indicates the extent to which a direction z of propagation of the illumination light 2 deviates from a normal to the entrance plane 44a upon entering into the waveguide 1. In FIG. 28, the intensity distribution for an untilted entrance "tilt 0 µm" is illustrated by a solid line. The intensity distribution for a tilt "tilt−1 mrad" is depicted by a dashed line, and that for a tilt "tilt+1 mrad" is depicted by a dotted line. In the case of the tilt, dependencies comparable to the dependencies of the intensity distribution on the decentration according to FIG. 27 arise, with the fundamental difference that, in the case of the intensity distributions according to FIG. 28, the intensity maxima are sensitive to the tilt. In this case, the sign of the intensity influencing of the intensity maxima changes as a result of the tilt from order of reflection to order of reflection and is additionally dependent on whether the tilt is effected toward positive or negative???. In the case of a specific intensity maximum, therefore, it is always possible to distinguish whether a tilt with respect to the normal to the entrance plane 44a in the xz-plane is effected toward positive or negative angles. In the range of orders of reflection that are large in absolute terms, the tilt dependence is greater than in the range of small orders of reflection.

The intensity distributions according to FIGS. 27 and 28 therefore make it possible to detect a focus position of the illumination light 2 upon entering into the waveguide 1 and also to exactly determine the ray direction of the illumination light 2. In this way, via the detection device 58, the illumination light 2 can be aligned with respect to the waveguide 1 within the scope of the measurement accuracy.

FIG. 29 shows an exemplary arrangement of sensor pairs which make it possible to detect firstly the decentration and secondly the tilt of the illumination light 2 in the main body entrance region 4 of the waveguide 1. The plane of the drawing in FIG. 29 corresponds to the detection plane 59. The illustration shows by way of example the two-dimensional intensity distribution of the coupling-out illumination light partial beams 11 in the detection plane 59, plotted against the coordinates x and y. A relative intensity value bar is plotted on the right in FIG. 29, and an assignment of the different hatchings to the relative intensity values indicated in the two-dimensional intensity distribution can be gathered from the bar.

The intensity distribution illustrated in FIG. 29, integrated in the y-direction and plotted against the x-direction corresponds to the solid intensity distributions according to FIGS. 27 and 28.

FIG. 29 shows the arrangement of the four sensor regions 63, 64, 65 and 66 of the sensor device 58. These sensor regions 63 to 66 correspond to the sensor regions which have already been discussed above in connection with FIGS. 20, 23 and 25. Instead of sensor regions 63 to 66 of a spatially resolving sensor, for example of a CCD camera, with a relatively large sensor region, individual sensors, for example individual photodiodes, can also be arranged at the location of the sensor regions 63 to 66. The individual sensors are likewise indicates below by the reference numerals 63 to 66. Insofar as, in the case of a relatively large spatially resolving sensor, a restriction to the sensor regions 63 to 66 is implemented, this can be done with the aid of corresponding shading stops which transmit the illumination light 2 to exclusively at the location of the sensor regions 63 to 66.

The sensors 63 to 66 detect in the detection plane 59 a segment of the entire coupling-out illumination light partial beams 11. The sensors 63 to 66 are signal-connected to the central control of the regulating device 53. The sensors 63 and 66 are arranged in mutually opposite edge regions of the intensity distribution. A center of the intensity distribution therefore lies between the two sensors 63 and 66.

The sensors 63 and 66 serve for measuring the tilt of the direction at propagation of the illumination light 2 in the main body entrance region 4, that is to say a "tilt" of the intermediate focus 45. The sensors 63 and 66 are therefore also designated hereinafter as "xt 1" (x tilt sensor 1) and "xt 2" (x tilt sensor 2). The sensors 63 and 66 measure a title of the direction of propagation of the illumination light 2 with respect to a normal z to the entrance plane 44a in the xz-plane. The sensors xt 1 and xt 2 are arranged in each case in the region of a maximum of the intensity distribution, wherein the order of the two maxima is chosen such the two maxima have a different sign of the dependence of an intensity change of a tilt of the intermediate focus 45.

The other two sensors 64 and 65 measure an x-decentration of the intermediate focus 45. The sensor 64 is therefore also designated hereinafter as "dx 1" and the sensor 65 as "dx 2". The two sensors dx 1 and dx 2 are arranged in minima of the intensity distribution, adjacent minima in the center of the intensity distribution being chosen here.

Instead of a sensor pair 63/66 and 64/65, on the other hand, it is also possible in each case to use only one sensor for measuring the tilt and the decentration of the illumination light 2 upon entering into the waveguide, for example the sensor 63 by itself for the tilt and the sensor 64 by itself for the decentration.

A corresponding arrangement of sensors can be used for the y-direction. This is illustrated by way of example for the decentration sensors 64, 65 in FIG. 30. The sensors 64x and 65x in FIG. 30 correspond to the sensors 64 and 65 in FIG. 29. Two further sensors 64y and 65y are additionally arranged in FIG. 30 and measure a y-decentration of the intermediate focus 45, as already explained above for the x-dimension in connection with the sensors 64, 65. The sensors 64y and 65y (dy1 and dy2) are likewise arranged in minima of the intensity distribution, wherein adjacent minima in the center of the intensity distribution can likewise be chosen. This results in an arrangement of the sensors 65y, 64x, 64y and 65x with four-fold symmetry in four quadrants I, II, II, IV around the center of the intensity distribution, as illustrated in FIG. 30. Such a sensor arrangement can be realized with the aid of a quadrant detector, the quadrants of which correspond to the quadrants I to IV in FIG. 30. In order to reduce a measurement window of the individual quadrants I to IV of such a quadrant detector, it is possible to provide shading stops which transmit the illumination light 2 only at the location of the sensor regions 65y, 64x, 64y, 65x of the arrangement according to FIG. 30.

FIG. 31 shows typical measurement results of a Sensor signal ratio dx 1/dx 2, on the one hand, and xt 1/xt 2, on the other hand. The ratio is indicated in percent units, wherein a normalization for the undisturbed case "no decentration" and "no tilt" to the value 100% has been performed.

FIG. 31 shows that from the signal ratios dx 1/dx 2, on the one hand, and xt 1/xt 2, on the other hand, it is possible to deduce the tilt and decentration of the intermediate focus 45 with good accuracy. Moreover, the decentration can be excellently distinguished from the tilt since the tilt sensors xt 1 and xt 2 are virtually exclusively sensitive to the tilt and the decentration sensors dx 1, dx 2 are virtually exclusively sensitive to the decentration, as far as the respective signal ratio is concerned. The illustration shows the ratio values for the decentrations −50 μm, 0 μm and +50 μm and for the tilts −1 mrad, 0 mrad and +1 mrad.

Virtually exclusively the signal ratio dx 1/dx 2 changes in the case of the different decentration values. The signal ratio is very much less than the value 100% in the case of the decentration −50 μm and very much greater than the value 100% in the case of the decentration+50 μm, such that the direction of the decentration can also be deduced from the ratio.

Practically only the signal ratio of the tilt sensors xt 1 and xt 2 changes in the case of the different tilt values −1 mrad, 0 mrad and +1 mrad. Here as well the tilt direction can be deduced from the signal ratio since the signal ratio is very much greater than 100% in the case of the tilt−1 mrad and is very much less than 100% in the case of the tilt+1 mrad.

In one alternative configuration, the sensors 63 to 66 can also detect an entire strip of the cross section of the coupling-out illumination light partial beams 11, the strip running in the y-direction. An x-extent of the strip corresponds in each case to the x-position of the sensors 63 to 66.

In the same way, as already explained above in connection with the sensors 64y and 65y, the y-decentration and the y-tilt can be detected. Two further sensor pairs corresponding to the sensors 63 to 66 are then arranged are corresponding positions in the y-dimension of the intensity distribution of the coupling-out illumination light partial beams 11.

A displacement device 67 can be controlled via the signal ratio of the sensors 63 to 66, which displacement device, as indicated in FIG. 16, can be operatively connected to the light source 43 and/or, as indicated in FIG. 17, to the waveguide 1. A regulated tracking either of the light source 43 relative to the waveguide 1 and/or of the waveguide 1 relative to the light source 43 can be realized by this means, such that the intermediate focus 45 always remains optimally in position with regard to its centering and tilt.

FIG. 32 shows a variant of the optical waveguide 1 in which the coupling-out illumination light partial beams 11 is coupled out in operating intermissions of a used illumination. In the case of the waveguide 1 according to FIG. 32, the coupling-out illumination light partial beams 11 is coupled out via a displaceable coupling-out stop 68. The latter has a stop body 69 with an aperture 70. The stop body 69 is operatively connected to a stop displacement drive 71. Via the stop displacement drive 71, the stop body 69 can be displaced between a measurement position, shown in FIG. 32, and a neutral position, as indicated by a double-headed arrow 72 in FIG. 32. In the measurement position, the stop body 69, via the aperture 70, allows exclusively the coupling-out illumination light partial beam 11 to pass through the stop body 69, which can then be measured in the detection plane 59, as already explained above. In the measurement position, the stop body 69 is arranged very near to the exit plane 14 and is at a distance therefrom, for example, which is less than 100 μm. In the ray direction of the illumination light 2 the stop body 69 has a thickness which is very small and can be less than 50 μm, for example.

As an alternative to the arrangement shown in FIG. 32, the stop body in the measurement position can also be arranged in a field plane downstream of the exit plane 14, that is to say into a plane in which the exit plane 14 is imaged.

In principle, a field stop of an illumination optical unit in which the waveguide 1 according to FIG. 32 is used, the field stop already being present for other purposes, can be used as the coupling-out stop 68.

In the detection plane 59, it is possible to use a measurement technology that is likewise used for normal illumination operation, that is to say in the neutral position of the coupling-out stop 68, for example a pupil system measurement technology already present in the illumination system. Alternatively or additionally, it is possible to use a detection device, as already explained above for example in connection with FIGS. 18 to 26. Together with the stop body 69, in the measurement position, an imaging optical unit can also be introduced into the beam path of the coupling-out illumination light partial beams 11 and correspondingly conditions the coupling-out illumination light partial beam 11 for the measurement via the detection device 58.

In the measurement position of the coupling-out stop 68, the stop body 69 transmits a segment of the entire cross section of the illumination light which, with regard to its size and position, corresponds to the segment which is coupled out from the cross section in the embodiments described above.

The coupling-out devices explained above, that is to say in particular the coupling-out device 10, 20, 22, 24, 30, 32, 35, 36 and 68, need not necessarily be arranged in the main body exit region 5, that is to say near the exist plane 14. Alternatively, it is possible to arrange the coupling-out devices in or near a plane 14' that is optically conjugate with respect to the exit plane 14. This is explained in even greater detail below with reference to FIGS. 33 and 34, in particular on the basis of the example of the coupling-out device 10.

FIG. 33 shows an embodiment of the waveguide 1 which, apart from the arrangement of the coupling-out device corresponds to that which has already been explained above with reference to FIG. 1. Components identical to those which have already been explained above in connection with FIG. 1 bear the same reference numerals and will not be discussed in detail again. Components which differ from those according to FIG. 1 exclusively with regard to their positioning bear reference numerals provided with a prime in FIG. 33. The coupling-out device 10' is arranged in or near the image exit plane 14', that is to say the plane that is conjugate with respect to the exit plane 14. The exit plane 14 is imaged into the image exit plane 14' or coupling-out plane via an imaging optical unit 73 indicated schematically in FIG. 33. The imaging optical unit 73 can carry out a 1:1 imaging, as shown schematically in FIG. 33. A different imaging scale of the imaging optical unit 73, in particular a magnifying imaging scale, is also possible as indicated in FIG. 34. The further embodiment—illustrated schematically therein—of an imaging optical unit 74, which, in terms of its function, otherwise corresponds to the imaging optical unit 73 according to FIG. 33, images the exit plane 14 with a magnifying scale of 2:1 into the image exit plane 14'.

A different magnification scale in the range of between 1:1 and for example 10:1 is also possible, for example 3:1, 4:1, 5:1, or an even greater magnification scale.

On account of the magnification, a smaller angular spectrum results within the coupling-out illumination light partial beams 11 coupled out, which fosters coupling out at a grazing angle.

On account of the imaging effect of the imaging optical unit 73, the optical effect of the coupling-out device 10' in or near the image exit plane 14' corresponds to that of the coupling-out device 10 according to FIG. 1, such that the coupling-out device 10' separates the coupling-out illumination light partial beam 11 from the rest of the illumination light beam 15 emerging from the waveguide main body 3, as already explained above in connection with FIG. 1. It goes without saying that the other coupling-out devices explained above, too, instead of an arrangement in or near the exit plane 14, can also be arranged in the image exit plane 14' and have the same effect there are already explained above in connection with the arrangement in or near the exit plane 14.

On account of the 2:1 magnification effect of the imaging optical unit 74 according to FIG. 34, the illumination light upon passing through the image exit plane 14' then has a cross section 12' of double the size in comparison with the cross section 12. This simplifies the coupling out by a coupling-out device—arranged in or near the image exit plane 14'—of the type in particular of the coupling-out devices 10, 20, 22, 24, 30, 32, 35, 36 and 68 described above and reduces accuracy requirements made of the coupling-out devices with regard to their manufacture and/or positioning.

FIG. 33 also illustrates by way of example the application of a coupling-out device 68' of the type of the coupling-out device 68 according to FIG. 32, the coupling-out device 68' being arranged in the image exit plane 14'. The coupling-out device 68', which can be used as an alternative to the coupling-out device 10', is shown in the neutral position in FIG. 33 and can be displaced with the aid of the stop drive 71 into the measurement position, in which the coupling-out device 68' transmits exclusively a partial beam through the aperture 70 which corresponds to the coupling-out illumination light partial beam 11.

FIG. 16 shows, moreover, a further coupling-out device 75, which can be used alternatively or additionally and which can be arranged near the object plane 37a, that is to say near the object field 38 of the illumination system of the inspection apparatus 41. The coupling-out device 75 is embodied as a plane mirror which separates a coupling-out illumination light partial beam 11 from the rest of the illumination light beam 15 emerging from the waveguide main body. The coupling-out illumination light partial beam 11 reflected by the coupling-out plane mirror 75 can then be fed to a further measurement, for example to a dosimetry sensor 52 or a detection or sensor device 58 in a detection plane, for example in a pupil plane of the illumination system.

In the case of the coupling-out devices explained above, the coupling-out illumination light partial beam 11 coupled out can be fed in each case to a measurement, wherein the rest of the illumination light beam 15 is used for illuminating the reticle 42, for example. Alternatively, the respective coupling-out device can also couple out the coupling-out illumination light partial beam 11 coupled out for the purpose of illuminating the reticle 42, for example, and the rest of the illumination light which emerges from the waveguide main body and which is therefore not coupled out can be fed to the measurement and measured, as already explained above in particular in connection with the dosimetry sensor 52 and the detection or sensor arrangement 58.

The invention claimed is:

1. An optical assembly, comprising:
a waveguide comprising a main body configured to guide light from a first end of the main body to a second end of the main body so that the light exits the main body via the second end of the main body;
a mirror; and
a device,
wherein:
the second end of the main body is in an exit plane;
the mirror is in a plane that is: a) in the exit plane; b) near the exit plane; or c) conjugate with the exit plane; and
the mirror extends beyond the exit plane in a direction away from the main body so that at least a portion of mirror is external to the main body;
the mirror is configured to reflect a partial beam of light after the partial beam of light exits the second end of the main body to separate the partial beam of light from a rest of the light after the rest of the light exits the second end of the main body;
a cross section of the partial beam of light is a part of a cross section of the light that exits the second end of the main body; and
the mirror is configured so that the cross section of the partial beam of light is incident on the mirror;
the device is configured to detect a variable characteristic of the partial beam of light;
the device comprises a sensor in a region of a plane in which a ratio h1 to h3 is less than one;
h1 is a distance between rays of the same order of reflection in the partial beam of light proceeding from an identical point in a waveguide entrance region; and
h3 is a maximum distance between rays of zero order of reflection in the partial beam of light passing through a same point in a waveguide exit region.

2. The optical assembly of claim 1, wherein a mirror surface of the mirror faces the rest of the light beam.

3. The optical assembly of claim 1, wherein a mirror surface of the mirror faces away from the rest of the light beam.

4. The optical assembly of claim 1, wherein the main body comprises a hollow optical waveguide having a tubular main body with a continuous waveguide cavity.

5. The optical assembly of claim 1, wherein the main body comprises a solid body that is transmissive to the light.

6. The optical assembly of claim 1, wherein the sensor is configured to detect a beam segment of the partial beam of light.

7. The optical assembly of claim 1, comprising a plurality of sensors.

8. The optical assembly of claim 1, wherein the mirror is located in the exit plane.

9. The optical assembly of claim 1, wherein the mirror is located near the exit plane.

10. The optical assembly of claim 1, wherein the mirror is located in a plane that is conjugate with the exit plane.

11. The optical assembly of claim 1, wherein the main body is tubular with a continuous waveguide cavity comprising an internal reflective inner wall.

12. The optical assembly of claim 1, wherein the main body is a solid body that is transparent to the light or transmissive to the light.

13. The optical assembly of claim 1, wherein the mirror is configured so that the cross section of the partial beam of light is incident on the mirror with an angle of incidence that is in the range between 30° and 60°.

14. An apparatus, comprising:
an illumination optical unit comprising an assembly according to claim 1;
a light source configured to generate the light; and
a projection lens having an image plane,
wherein the apparatus is configured so that, during use of the apparatus:
the partial beam of light follows a path from the light source, through the waveguide and to the device; and the rest of the light follows a path from the light source, through the illumination optical unit to an illumination field, and through the projection lens to the image plane of the projection lens.

15. An apparatus, comprising:
an illumination optical unit comprising an assembly, the assembly comprising:
 a waveguide comprising a main body configured to guide light from a first end of the main body to a second end of the main body so that the light exits the main body via the second end of the main body; and
 a coupling-out device;
a light source configured to generate the light;
a first device; and
a second device configured to detect: a) an illumination field; or b) an image plane into which the illumination field is imaged,
wherein:
 the second end of the main body is in an exit plane;
 the coupling-out device is in a coupling-out plane that is: a) in the exit plane; b) near the exit plane; c) conjugate with the exit plane; or d) near a plane conjugate with the exit plane; and
 the coupling-out device is configured to reflect a partial beam of light after the partial beam of light exits the second end of the main body to separate the partial beam of light from a rest of the light after the rest of the light exits the second end of the main body;
 a cross section of the partial beam of light is a part of a cross section of the light that exits the second end of the main body; and
 the first device configured to detect a measurement variable characteristic of the partial beam of light;
 the apparatus is configured so that, during use of the apparatus:
  the partial beam of light follows a path from the light source, through the waveguide and to the first device;
  the rest of the light follows a path from the light source, through the illumination optical unit and to the illumination field so that the rest of the light is detectable via the second device; and
 the apparatus is configured to inspect a wafer or a mask.

16. The apparatus of claim 15, wherein the coupling-out device comprises a mirror.

17. The apparatus of claim 15, wherein the coupling-out device comprises a stop.

18. The apparatus of claim 15, wherein:
the first device comprises a sensor in a region of a plane in which a ratio h1 to h3 is less than one;

h1 is a distance between rays of the same order of reflection in the partial beam of light proceeding from an identical point in a waveguide entrance region; and
h3 is a maximum distance between rays of zero order of reflection in the partial beam of light passing through a same point in a waveguide exit region.

19. The apparatus of claim 15, wherein the first device comprises a dosimetry sensor.

20. The apparatus of claim 15, wherein the first device comprises a dosimetry sensor configured to detect the same angular distribution in a detection beam for the dosimetry sensor as the rest of the light beam.

21. The apparatus of claim 15, wherein the first device comprises a pyroelectric sensor.

22. The apparatus of claim 15, wherein the assembly comprises a sensor optical that is also part of the coupling-out device.

23. The apparatus of claim 15, wherein the first device comprises a field position sensor configured to detect the position of the illumination field.

24. The apparatus of claim 23, wherein the field position sensor is a spatially resolving sensor.

25. The apparatus of claim 24, wherein the spatially resolving sensor comprises a quadrant sensor.

26. The apparatus of claim 15, wherein the first device comprises a pupil sensor configured to measure an angular distribution of an illumination of the illumination field.

27. The apparatus of claim 15, further comprising:
a control/regulating device; and
a displacement device configured to drive a component of the apparatus,
wherein the first device is in signal connection with the control/regulating device, and the displacement device is in signal connection with the control/regulating device.

28. The apparatus of claim 15, further comprising a sensor optical unit configured to image the coupling-out plane into a detection plane of the first device.

29. The apparatus of claim 28, wherein the sensor optical unit comprises a concave mirror.

30. The apparatus of claim 28, wherein the sensor optical unit comprises an aperture stop to avoid detection of a higher aperture with the first device compared to the rest of the light beam.

31. The apparatus of claim 28, wherein the sensor optical unit comprises a reflective coating to avoid a detection of a higher aperture with the first device compared to the rest of the light beam.

32. The apparatus of claim 15, further comprising a second measuring device, wherein the second measuring device is configured to measure a decentration and a tilt of the illumination light upon entering into the waveguide.

* * * * *

UNITED STATES PATENT AND TRADEMARK OFFICE
CERTIFICATE OF CORRECTION

PATENT NO. : 10,254,466 B2
APPLICATION NO. : 15/608390
DATED : April 9, 2019
INVENTOR(S) : Christian Wald et al.

Page 1 of 1

It is certified that error appears in the above-identified patent and that said Letters Patent is hereby corrected as shown below:

In the Specification

Column 4, Line 34: Delete "wave-guide" and insert -- waveguide --, therefor.

Column 9, Line 64: Delete "t" and insert -- to --, therefor.

Column 13, Lines 24-39: Delete "The inspection apparatus 41 has a light source 43 for generating the illumination light 2. The light source 43 can generate EUV used radiation in a wavelength range of between 2 nm and 30 nm, for example in the range of between 2.3 nm and 4.4 nm or in the range of between 5 nm and 30 nm. The light sources that are also customary for EUV lithography systems or projection exposure apparatuses, that is to say, for example, laser plasma sources (LPP; Laser Produced Plasma) or else discharge sources (DPP; Discharge Produced Plasma), are appropriate for the light source 43. Via a deflection mirror 44, which simultaneously has beam shaping properties, the illumination light 2 is coupled into the waveguide 1. The deflection mirror 44 generates an intermediate focus 45 in the region of an entrance plane 42a of the waveguide 1. The exit plane 14 of the waveguide 1 constitutes a field plane." and insert the same in Column 13, Line 25, as a new paragraph.

Column 23, Line 14 (approx.): Delete "decentration+50" and insert -- decentration + 50 --, therefor.

In the Claims

Column 28, Line 15 (approx.): In Claim 22, delete "a sensor optical" and insert -- an optical sensor --, therefor.

Signed and Sealed this
Ninth Day of July, 2019

Andrei Iancu
*Director of the United States Patent and Trademark Office*